(12) United States Patent
Hao et al.

(10) Patent No.: US 10,797,269 B2
(45) Date of Patent: *Oct. 6, 2020

(54) POLYMERIC FILMS AND DISPLAY DEVICES CONTAINING SUCH FILMS

(71) Applicant: 3M INNOVATIVE PROPERTIES COMPANY, St. Paul, MN (US)

(72) Inventors: Encai Hao, Woodbury, MN (US); Zhaohui Yang, North Oaks, MN (US); Albert I. Everaerts, Tucson, AZ (US); Yongshang Lu, Woodbury, MN (US); William Blake Kolb, Stillwater, MN (US); Keith R. Bruesewitz, River Falls, WI (US)

(73) Assignee: 3M INNOVATIVE PROPERTIES COMPANY, St. Paul, MN (US)

(*) Notice: Subject to any disclaimer, the term of this patent is extended or adjusted under 35 U.S.C. 154(b) by 0 days.

This patent is subject to a terminal disclaimer.

(21) Appl. No.: 16/674,530

(22) Filed: Nov. 5, 2019

(65) Prior Publication Data
US 2020/0075894 A1 Mar. 5, 2020

Related U.S. Application Data

(63) Continuation of application No. PCT/US2018/030927, filed on May 3, 2018, which is
(Continued)

(51) Int. Cl.
*H01L 29/08* (2006.01)
*H01L 51/52* (2006.01)
(Continued)

(52) U.S. Cl.
CPC ........ *H01L 51/5275* (2013.01); *C08F 220/18* (2013.01); *C08F 220/28* (2013.01);
(Continued)

(58) Field of Classification Search
CPC .. H01L 51/004; H01L 51/097; H01L 51/5275
(Continued)

(56) References Cited

U.S. PATENT DOCUMENTS 7,385,007 B2 6/2008 Moroishi
8,557,378 B2 10/2013 Yamanaka
(Continued)

FOREIGN PATENT DOCUMENTS

CA 2678273 3/2010
CA 2688618 6/2010
(Continued)

OTHER PUBLICATIONS

Pyo, "A Nanoporous Polymer Film as a Diffuser as Well as a Light Extraction Component for Top Emitting Organic Light Emitting Diodes With a Strong Microcavity Structure," Nanoscale, Mar. 2016, vol. 8, pp. 8575-8582.

*Primary Examiner* — Tan N Tran
(74) *Attorney, Agent, or Firm* — Lisa P. Fulton

(57) ABSTRACT

Polymeric films, which may be adhesive films, and display devices including such polymeric films, wherein a polymeric film includes: a first polymeric layer having two major surfaces, wherein the first polymeric layer includes a first polymeric matrix and particles. The first polymeric layer includes: a first polymeric matrix having a refractive index ni; and particles having a refractive index $n_2$ uniformly dispersed within the first polymeric matrix; wherein the particles are present in an amount of less than 30 vol-%, based on the volume of the first polymeric layer, and have a particle size range of 400 nanometers (nm) to 3000 nm; and wherein ni is different than $n_2$.

21 Claims, 13 Drawing Sheets

Related U.S. Application Data a continuation of application No. 15/587,984, filed on May 5, 2017, now Pat. No. 9,960,389.

(51) Int. Cl.

| | |
|---|---|
| *C09J 123/20* | (2006.01) |
| *H01L 51/00* | (2006.01) |
| *C09J 133/08* | (2006.01) |
| *C08L 33/08* | (2006.01) |
| *C08L 33/14* | (2006.01) |
| *C09D 133/14* | (2006.01) |
| *C08L 23/20* | (2006.01) |
| *C09J 7/10* | (2018.01) |
| *G02B 5/02* | (2006.01) |
| *C08F 220/18* | (2006.01) |
| *C08F 220/28* | (2006.01) |
| *C09D 133/08* | (2006.01) |

(52) U.S. Cl.
CPC ............... *C08L 23/20* (2013.01); *C08L 33/08* (2013.01); *C08L 33/14* (2013.01); *C09D 133/08* (2013.01); *C09D 133/14* (2013.01); *C09J 7/10* (2018.01); *C09J 123/20* (2013.01); *C09J 133/08* (2013.01); *G02B 5/02* (2013.01); *G02B 5/0242* (2013.01); *G02B 5/0268* (2013.01); *H01L 51/004* (2013.01); *C08L 2201/10* (2013.01); *C08L 2203/20* (2013.01); *C08L 2205/22* (2013.01); *C09J 2201/134* (2013.01); *C09J 2201/36* (2013.01); *C09J 2201/622* (2013.01); *C09J 2203/318* (2013.01); *C09J 2203/326* (2013.01); *C09J 2205/102* (2013.01); *C09J 2205/114* (2013.01); *C09J 2423/00* (2013.01); *C09J 2433/00* (2013.01); *C09J 2475/00* (2013.01); *C09J 2483/00* (2013.01); *H01L 51/0097* (2013.01); *H01L 51/5268* (2013.01); *H01L 2251/5338* (2013.01); *H01L 2251/5369* (2013.01)

(58) Field of Classification Search
USPC ............................................. 257/40, E39.007
See application file for complete search history.

(56) References Cited

U.S. PATENT DOCUMENTS

| | | | |
|---|---|---|---|
| 8,808,811 | B2 | 8/2014 | Kolb |
| 9,487,684 | B2 | 11/2016 | Krawinkel |
| 9,543,549 | B2 | 1/2017 | Bai |
| 9,960,389 | B1 * | 5/2018 | Hao ..................... C08F 220/28 |
| 2009/0087629 | A1 | 4/2009 | Everaerts |
| 2009/0110924 | A1 | 4/2009 | Inoue |
| 2010/0014162 | A1 | 1/2010 | Bunde |
| 2010/0028564 | A1 | 2/2010 | Cheng |
| 2010/0040842 | A1 | 2/2010 | Everaerts |
| 2011/0126968 | A1 | 6/2011 | Determan |
| 2012/0313508 | A1 | 12/2012 | Son |
| 2013/0202867 | A1 | 8/2013 | Coggio |
| 2014/0299844 | A1 | 10/2014 | You |
| 2014/0319497 | A1 | 10/2014 | Cho |
| 2015/0322296 | A1 | 11/2015 | Keite-Telgenbuscher |
| 2015/0337174 | A1 | 11/2015 | Keite-Telgenbuscher |
| 2016/0001521 | A1 | 1/2016 | Tanaka |
| 2016/0068717 | A1 | 3/2016 | Gasa |
| 2016/0109625 | A1 | 4/2016 | Guimard |
| 2016/0122600 | A1 | 5/2016 | Moon |
| 2016/0130476 | A1 | 5/2016 | Lee |
| 2016/0155967 | A1 | 6/2016 | Lee |
| 2017/0101556 | A1 | 4/2017 | Keite-Telgenbuscher |

FOREIGN PATENT DOCUMENTS

| | | |
|---|---|---|
| CN | 103207523 | 4/2015 |
| DE | 102010043866 | 5/2012 |
| DE | 102010043871 | 5/2012 |
| DE | 102014208111 | 10/2015 |
| EP | 2055755 | 5/2009 |
| JP | 2004-224991 | 8/2004 |
| JP | 2010-100710 | 5/2010 |
| JP | 2014-159557 | 9/2014 |
| KR | 10-2006-0119030 | 11/2006 |
| KR | 10-2013-0031209 | 3/2013 |
| WO | WO 2001-018887 | 3/2001 |
| WO | WO 2002-057384 | 7/2002 |
| WO | WO 2003-085424 | 10/2003 |
| WO | WO 2003-106582 | 12/2003 |
| WO | WO 2006-003827 | 1/2006 |
| WO | WO 2008-128073 | 10/2008 |
| WO | WO 2009-086095 | 7/2009 |
| WO | WO 2010-033558 | 3/2010 |
| WO | WO 2010-063579 | 6/2010 |
| WO | WO 2010-092995 | 8/2010 |
| WO | WO 2011-018356 | 2/2011 |
| WO | WO 2011-018358 | 2/2011 |
| WO | WO 2011-062932 | 5/2011 |
| WO | WO 2011-082069 | 7/2011 |
| WO | WO 2012-019909 | 2/2012 |
| WO | WO 2013-015096 | 1/2013 |
| WO | WO 2013-035723 | 3/2013 |
| WO | WO 2013-056952 | 4/2013 |
| WO | WO 2013-057264 | 4/2013 |
| WO | WO 2013-057265 | 4/2013 |
| WO | WO 2013-073900 | 5/2013 |
| WO | WO 2013-073902 | 5/2013 |
| WO | WO 2013-103283 | 7/2013 |
| WO | WO 2013-131707 | 9/2013 |
| WO | WO 2013-137621 | 9/2013 |
| WO | WO 2013-147156 | 10/2013 |
| WO | WO 2013-147571 | 10/2013 |
| WO | WO 2013-180374 | 12/2013 |
| WO | WO 2014-007219 | 1/2014 |
| WO | WO 2014-029545 | 2/2014 |
| WO | WO 2014-069398 | 5/2014 |
| WO | WO 2014-084352 | 6/2014 |
| WO | WO 2014-095385 | 6/2014 |
| WO | WO 2014-115639 | 7/2014 |
| WO | WO 2014-163135 | 10/2014 |
| WO | WO 2015-020407 | 2/2015 |
| WO | WO 2015-020408 | 2/2015 |
| WO | WO 2015-020410 | 2/2015 |
| WO | WO 2015-020411 | 2/2015 |
| WO | WO 2015-020412 | 2/2015 |
| WO | WO 2015-020413 | 2/2015 |
| WO | WO 2015-068558 | 5/2015 |
| WO | WO 2015-129624 | 9/2015 |
| WO | WO 2015-129625 | 9/2015 |
| WO | WO 2016-052137 | 4/2016 |
| WO | WO 2016-066434 | 5/2016 |
| WO | WO 2016-066437 | 5/2016 |

\* cited by examiner

POLYMERIC FILMS AND DISPLAY DEVICES CONTAINING SUCH FILMS

BACKGROUND

Organic light emitting diodes (OLEDs) currently are used in small-screen devices such as cell phones, personal display devices (PDAs), and digital cameras. Current OLED markets are dominated by active-matrix organic light-emitting diode (AMOLED) handhelds, which have a top-emissive architecture and currently do not use any light extraction method except for employing strong microcavity. This strong cavity design can have high light efficiency, but the angular color uniformity is much worse, when compared to that of liquid crystal displays (LCDs).

Typically, the color for an OLED screen shifts greatly as viewing angle increases away from normal incidence, but an LCD display shifts only slightly. This is a visually evident difference between the two display technologies. How to improve the angular color uniformity remains a challenge for AMOLED displays with strong cavity design.

SUMMARY OF THE DISCLOSURE

The present disclosure provides polymeric films, which may be adhesive films, and display devices including such polymeric films.

In one embodiment, a polymeric film includes: a first polymeric layer having two major surfaces, wherein the first polymeric layer includes a first polymeric matrix and particles (preferably, polymeric particles). The polymeric film has: a clarity of at least 80%; a visible light transmission of at least 85%; a bulk haze of 15% to 80%; and a normalized micro-haze non-uniformity of not more than 12% across the polymeric film. In certain embodiments, such polymeric film is void-free. In this context, "void-free" means that there is less than 0.5 volume percent (vol-%) pores or voids.

Such a prescribed polymeric film has the optical function of a very moderate optical diffuser with controlled local uniformity.

The first polymeric layer includes: a first polymeric matrix having a refractive index $n_1$; and particles having a refractive index $n_2$ uniformly dispersed within the first polymeric matrix; wherein the particles are present in an amount of less than 30 vol-%, based on the volume of the first polymeric layer, and have a particle size range of 400 nanometers (nm) to 3000 nm; and wherein $n_1$ is different than $n_2$.

In one embodiment, a display device includes: an organic light emitting diode panel having a multi-layer construction that includes one or more adhesive films; and a polymeric film as described herein incorporated within the multi-layer construction of the organic light emitting diode panel (e.g., within an adhesive film or as a replacement for an adhesive film); wherein the polymeric film comprises at least one adhesive matrix.

In another embodiment, a display device includes: an organic light emitting diode panel having a multi-layer construction including one or more adhesive films; and a polymeric film incorporated within the multi-layer construction of the organic light emitting diode panel (e.g., within an adhesive film or as a replacement for an adhesive film). The polymeric film includes: a first polymeric layer having two major surfaces, wherein the first polymeric layer comprises: a first polymeric matrix having a refractive index $n_1$; and particles having a refractive index $n_2$ uniformly dispersed within the first polymeric matrix; wherein the particles are present in an amount of less than 30 vol-%, based on the volume of the first polymeric layer, and have a particle size range of 400 nm to 3000 nm; and wherein $n_1$ is different than $n_2$.

The term "haze" refers to wide angle light scattering, wherein light emitting from a display is diffused in all directions causing a loss of contrast. More particularly, the term "bulk haze" refers to the wide angle light scatter measured with a broad sampling beam of several millimeters (mm) so as to give an average result from said several-millimeter aperture of the polymeric film. Also, more particularly, the term "micro-haze" refers to wide angle light scattering as measured by a smaller illuminated area of tens of microns (i.e., less than 100 microns, e.g., 10 to 40 microns) such that the average micro-haze measurement represents the average result from many measurements, each tens of microns in area, extending over several millimeters of the polymeric film.

The term "normalized micro-haze non-uniformity" refers to the ratio of the standard deviation of the micro-haze to the average value of micro-haze when measured over at least 1 mm, and typically over several millimeters. The standard deviation of micro-haze is a measure of micro-haze noise. As such, normalized micro-haze non-uniformity is a metric for the ratio of visual micro-haze noise to micro-haze signal.

The term "clarity" refers to narrow angle scattering, wherein light is diffused in a small angle range with high concentration. The effect of having a certain clarity basically describes how well very small details can be seen through a specimen.

The terms "polymer" and "polymeric material" include, but are not limited to, organic homopolymers, copolymers, such as for example, block, graft, random, and copolymers, terpolymers, etc., and blends and modifications thereof. Furthermore, unless otherwise specifically limited, the term "polymer" shall include all possible geometrical configurations of the material. These configurations include, but are not limited to, isotactic, syndiotactic, and atactic symmetries.

Herein, the term "comprises" and variations thereof do not have a limiting meaning where these terms appear in the description and claims. Such terms will be understood to imply the inclusion of a stated step or element or group of steps or elements but not the exclusion of any other step or element or group of steps or elements. By "consisting of" is meant including, and limited to, whatever follows the phrase "consisting of." Thus, the phrase "consisting of" indicates that the listed elements are required or mandatory, and that no other elements may be present. By "consisting essentially of" is meant including any elements listed after the phrase, and limited to other elements that do not interfere with or contribute to the activity or action specified in the disclosure for the listed elements. Thus, the phrase "consisting essentially of" indicates that the listed elements are required or mandatory, but that other elements are optional and may or may not be present depending upon whether or not they materially affect the activity or action of the listed elements.

The words "preferred" and "preferably" refer to embodiments of the disclosure that may afford certain benefits, under certain circumstances. However, other embodiments may also be preferred, under the same or other circumstances. Furthermore, the recitation of one or more preferred embodiments does not imply that other embodiments are not useful, and is not intended to exclude other embodiments from the scope of the disclosure.

In this application, terms such as "a," "an," and "the" are not intended to refer to only a singular entity, but include the general class of which a specific example may be used for illustration. The terms "a," "an," and "the" are used interchangeably with the term "at least one." The phrases "at least one of" and "comprises at least one of" followed by a list refers to any one of the items in the list and any combination of two or more items in the list.

As used herein, the term "or" is generally employed in its usual sense including "and/or" unless the content clearly dictates otherwise.

The term "and/or" means one or all of the listed elements or a combination of any two or more of the listed elements.

Also herein, all numbers are assumed to be modified by the term "about" and in certain embodiments, preferably, by the term "exactly." As used herein in connection with a measured quantity, the term "about" refers to that variation in the measured quantity as would be expected by the skilled artisan making the measurement and exercising a level of care commensurate with the objective of the measurement and the precision of the measuring equipment used. Herein, "up to" a number (e.g., up to 50) includes the number (e.g., 50).

Also herein, the recitations of numerical ranges by endpoints include all numbers subsumed within that range as well as the endpoints (e.g., 1 to 5 includes 1, 1.5, 2, 2.75, 3, 3.80, 4, 5, etc.).

As used herein, the term "room temperature" refers to a temperature of 20° C. to 25° C., or in certain embodiments, 22° C. to 25° C.

The term "in the range" or "within a range" (and similar statements) includes the endpoints of the stated range.

Groupings of alternative elements or embodiments disclosed herein are not to be construed as limitations. Each group member may be referred to and claimed individually or in any combination with other members of the group or other elements found therein. It is anticipated that one or more members of a group may be included in, or deleted from, a group for reasons of convenience and/or patentability. When any such inclusion or deletion occurs, the specification is herein deemed to contain the group as modified thus fulfilling the written description of all Markush groups used in the appended claims.

Reference throughout this specification to "one embodiment," "an embodiment," "certain embodiments," or "some embodiments," etc., means that a particular feature, configuration, composition, or characteristic described in connection with the embodiment is included in at least one embodiment of the invention. Thus, the appearances of such phrases in various places throughout this specification are not necessarily referring to the same embodiment of the invention. Furthermore, the particular features, configurations, compositions, or characteristics may be combined in any suitable manner in one or more embodiments.

The above summary of the present disclosure is not intended to describe each disclosed embodiment or every implementation of the present invention. The description that follows more particularly exemplifies illustrative embodiments. In several places throughout the application, guidance is provided through lists of examples, which examples may be used in various combinations. In each instance, the recited list serves only as a representative group and should not be interpreted as an exclusive list.

DETAILED DESCRIPTION OF ILLUSTRATIVE EMBODIMENTS

The present disclosure provides polymeric films and display devices that include these polymeric films. The polymeric film includes a polymeric layer having two major surfaces, wherein the polymeric layer includes a polymeric matrix and particles (preferably, polymeric particles).

This polymeric layer having particles is referred to as the first polymeric layer. The first polymeric layer includes: a first polymeric matrix having a refractive index $n_1$; and particles having a refractive index $n_2$ uniformly dispersed within the first polymeric matrix; wherein the particles are present in an amount of less than 30 vol-%, based on the volume of the first polymeric layer, and have a particle size range of 400 nanometers (nm) to 3000 nm; and wherein $n_1$ is different than $n_2$. Such a polymeric film has the optical function of a very moderate optical diffuser.

In certain embodiments, the first polymeric layer is the only polymeric layer of the polymeric film of the present disclosure. In certain embodiments, the first polymeric layer is one of two polymeric layers of the polymeric film of the present disclosure. In certain embodiments, the first polymeric layer is one of two or more polymeric layers of the polymeric film of the present disclosure.

Figure 1:
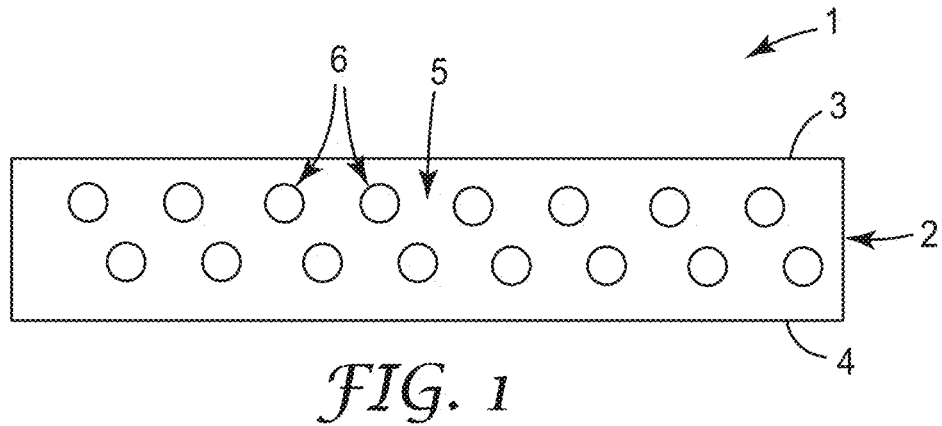
FIG. 1 is a cross-sectional representation of a single-layer polymeric film of the present disclosure.

As shown in FIG. 1, in certain embodiments, polymeric film 1 includes a polymeric layer 2 having two major surfaces 3 and 4, wherein the polymeric layer 2 includes a polymeric matrix 5 and particles 6 (preferably, polymeric particles) uniformly dispersed within this first polymeric matrix 5. In certain embodiments, such polymeric film 1 is void-free. In this context, "void-free" means that there is less than 0.5 volume percent (vol-%) pores or voids.

Figure 2:
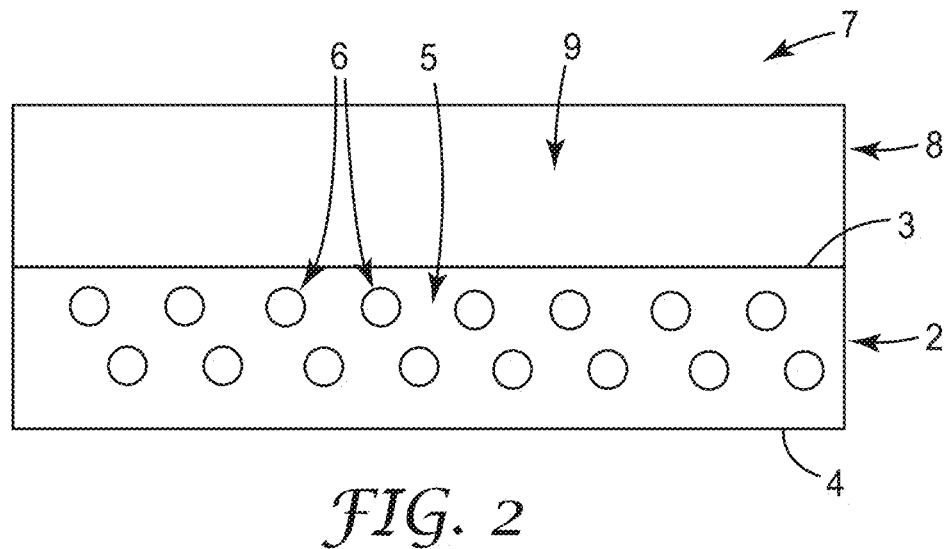
FIG. 2 is a cross-sectional representation of a dual-layer polymeric film of the present disclosure (layers are not to scale).

As shown in FIG. 2, in certain embodiments, polymeric film 7 of the present disclosure includes a second polymeric layer 8 disposed on one major surface 3 of the first polymeric layer 2, which includes polymeric matrix 5 (i.e., first polymeric matrix 5) and particles 6. The second polymeric layer 8 includes a second polymeric matrix 9. The first polymeric matrix 5 and the second polymeric matrix 9 may be the same or different.

The first polymeric matrix (the matrix in which the particles are dispersed) has a refractive index $n_1$, and the second polymeric matrix has a refractive index $n_3$. In certain embodiments, the first polymeric matrix and the second polymeric matrix include the same material. In certain embodiments, the first polymeric matrix is different than the second polymeric matrix.

In certain embodiments, if the first and second polymeric matrices are different, $n_1$ is at least 0.05 unit different than $n_3$. In certain embodiments, $n_1$ is within 0.2 unit of $n_3$, and in certain embodiments, $n_1$ is within 0.1 unit of $n_3$. In this context "within" means within 0.2 unit (or 0.1 unit) higher or lower.

In certain embodiments, at least one of the first polymeric matrix and the second polymeric matrix is an adhesive matrix. In certain embodiments, the first polymeric matrix and the second polymeric matrix each comprises an adhesive matrix. In certain embodiments, the first adhesive matrix and the second adhesive matrix include the same material. In certain embodiments, the first adhesive matrix is different than the second adhesive matrix.

In certain embodiments, the first (possibly only) polymeric layer of the polymeric film has a thickness of at least 10 micrometers (microns or μm). In certain embodiments, the first (possibly only) polymeric layer of the polymeric film has a thickness of up to 100 microns, or up to 50 microns, or up to 25 microns, or up to 15 microns.

In certain embodiments, the second polymeric layer of the polymeric film has a thickness of at least 25 microns. There is no maximum thickness to this second polymeric layer, although, in certain embodiments, it may be up to 1 millimeter (mm) thick.

In certain embodiments, the overall polymeric film has a thickness of at least 35 microns. In certain embodiments, the overall polymeric film has a thickness of up to 130 microns. A polymeric film of the present disclosure has the following characteristics: a clarity of at least 80% (preferably at least 85%, or more preferably at least 90%); a visible light transmission of at least 85% (preferably at least 90%); a bulk haze of 15% to 80% (preferably 20% to 80%, more preferably 30% to 70%, and even more preferably 30% to 50%); and a normalized micro-haze non-uniformity of not more than 12% (preferably less than 10%, or more preferably less than 8%) across the polymeric film.

Accordingly, such films can be used in display devices, particularly devices that include an organic light-emitting diode display panel. They can function as very moderate optical diffusers with controlled local uniformity. The clarity, transmission, and bulk haze can be measured using a Haze Gard Plus (from BYK Gardner, Columbia, Md.), which reports measurements from a sampling beam of 18 millimeters (mm) aperture of the polymeric film, as described in the Examples Section.

The visually perceived quality of a pixelated display requires a particular uniformity of the controlled haze for spatial distributions on the order of the length scale of the display pixels. Non-uniformity of the haze above the order of length scale of the display pixels can lead to optical defects such as pixel blur or so-called sparkle. This quality is measureable by means of a micro-haze uniformity measurement (Optical Property Test Method: Micro-Haze Uniformity described in the Examples Section), which provides measurements from a sampling beam illuminating a few tens of microns of the sample. In this measurement, the polymeric film surface is scanned with an optical probe that has sub-pixel dimensions while measuring standard deviation in the measured micro-haze levels. This micro-haze measurement technique allows sample analysis for spatial frequencies corresponding to the peak for human vision perception—namely, spatial frequencies in the range of 1-5 line pairs per millimeter for typical viewing distances. The micro-haze measurements allow the examination of size scale variations on the size scale for display pixel dimensions. In contrast, conventional haze measurement systems analyze a large area of the optical film for each measurement and are unable to distinguish visually perceived differences on the critical length scales for pixelated displays.

The polymeric films of the present disclosure can significantly improve the known problem of color variation with viewing angle for OLED displays. This problem is commonly labelled off-angle color shift, or angular color non-uniformity, and the solution to the problem described herein is referred to as Wide View Color (WVC) correction. Thus, the polymeric films of the present disclosure are referred to herein as Wide View Color (WVC) correction films or WVC correction polymeric films.

A WVC correction polymeric film not only significantly improves angular color uniformity, it is compatible with a circular polarizer, maintains brightness and viewing angle, and does not noticeably introduce visual defects, such as commonly known pixel blur or localized scattering anomalies (known as "sparkle"). The pixel blur for said polymeric films is only slightly visible under a microscope, with negligible light blurred into the neighboring pixels, so the visual appearance of the display pixels is essentially maintained.

Significantly, the polymeric films control light diffusion and significantly improve angular color uniformity of OLED displays by controlling the differences in refractive indices between the particles and the polymeric matrix, the size and loading of the particles, the thickness of the polymeric films, and the distance between the first polymeric layer of the polymeric film and display. The larger the distance between the first polymeric layer of the polymeric film and the emissive display plane, the more undesirable pixel blur increases. The smaller the pixel size, the closer the first polymeric layer of the polymeric film and display plane should be. Also, as this distance increases, the contrast ratio becomes undesirably low. Because of these two factors, the distance between the first polymeric layer of the polymeric film and the emissive display plane is desirably minimized. For one example, for commercially available handheld devices having typical pixel spacing of 50 microns, the distance between the first polymeric layer of the polymeric film and the emissive display plane should preferably be less than 150 microns. For an additional example, large display monitors having typical pixel spacing of 500 microns, the distance between the first polymeric layer of the polymeric film and the emissive display plane should preferably be less than 1500 microns. In general, the distance between the first polymeric layer of the polymeric film and the emissive display plane is desirably less than 3 times the pixel spacing dimension of the display. Smaller first polymeric layer to display plane distances are even more preferable. In some embodiments, the distance between the first polymeric layer of the polymeric film and the emissive display plane is desirably less than 2 times the pixel spacing dimension of the display. In other embodiments, the distance between the first polymeric layer of the polymeric film and the emissive display plane is desirably less than the pixel spacing dimension for the display. The polymeric films do not significantly affect major performance characteristics, including brightness, circular polarizer compatibility, and view angle. Also, importantly, the pixel blur can be significantly reduced.

Particles

In the current disclosure, particles, such as polymeric particles, are uniformly dispersed within a polymeric matrix. In this context, "uniformly dispersed" means a continuous randomly dispersed particle distribution throughout a polymeric matrix. Such dispersed particles are dispersed individual particles, not aggregates or aggregations of particles. The presence of such aggregates creates highly localized haze differences that show up in a lit display as a defect known in the industry as sparkle. Unlike typical bulk diffusers that are often positioned on the backside of the display panel, such as an LCD, the current application requires that the optical film be placed between the display panel and the viewer, making defects due to particle aggregation more obvious. In addition, for wide view color applications a high clarity of the optical film is often desired. Such clarity would also make particle agglomerates more apparent, in contrast with typical diffusers which are commonly higher in haze and lower in clarity.

In order to get uniformly dispersed particles in a polymer matrix, mixing processes and coating methods need to be controlled. For example, to effectively disperse particles in a polymer precursor (for example, curable monomers) or a polymer composition, mechanical mixing may be carried out for a period of time on the order of minutes. Alternatively, rolling of samples (dry particles added to polymer precursor or solution) may be carried out, although to get complete and homogenous particle dispersion this may have to be done for extensive periods of time (e.g., on the order of days or weeks). Thus, roller mixing is not very practical or effective, and mechanical mixing is preferred because of its efficiency and high shearing capability, which helps break up any particle agglomerates that may be present during the initial mixing.

In addition to mechanical mixing, controlled (slow) addition of the particles to the components being mechanically mixed is typically necessary to avoid agglomeration of the individual particles. Rapid addition of particles can easily form a "wet-cake-like solid" that is difficult to redisperse once formed. Slow addition can involve adding small volumes (i.e., small shots) of particles so the mixer does not get overwhelmed and a cake is not formed. Once a small shot of particles is mixed in, another shot is added. Once a cake forms, it can be difficult to break it up and get a completely uniform dispersion in a reasonable amount of time.

Thus, in certain embodiments, to effectively uniformly disperse particles in a polymer matrix, a high shear mixer (e.g., disperser disk DSFB635, manufactured by Promix, Ontario, Canada) in combination with slow addition of the particles is preferred. Typically, for the more robust polymer or inorganic beads, high shear can be used, while for softer or more fragile particles, lower but longer shear exposure is recommended.

Unlike the Comparative Examples 20 and 21 (see Examples Section), where the particles were simply dispersed in the monomer syrup and mixed on a roller for 24 hours (following one of the general procedures disclosed in International Publication No. WO 2010/033558), additional mechanical stirring significantly reduces sparkle. In contrast to the methods used in International Publication No. WO 2010/033558 (which typically involved dumping particles in a syrup and mixing on a roller mixer for only a few hours because dispersion uniformity was not necessary for the desired application, e.g., backside diffuser foran LCD), mechanically stirring (i.e., mechanically mixing) can significantly reduce particle aggregations in solution, resulting in a uniform dispersion of particles in a coated polymer matrix. In addition, sufficient mixing time can be used to break up particle aggregations in solution, if it occurs. Furthermore, to avoid particle settling and/or agglomeration, polymer/particle mixtures are continuously mixed, at least on a roller, until they are coated onto a substrate. In-line mixing during the coating process can be advantageously used, provided the shear/mixing time is sufficient to uniformly disperse the particles in the coating composition. In-line mixers such as those available from Quadro (Waterloo, Ontario, Canada) may be useful.

To retain uniformly dispersed particles in the final polymeric film, it is also preferred that a coating composition is coated through a precision coating method, such as slot die coating, where a relatively large gap between the die and carrier film is preferred. For Examples 25-27, the addition of an optical clear adhesive layer that is not optically functional (diffusive) opens more gap between the die and carrier film, as a result, providing uniformly dispersed samples. Coating methods where dispersed particles may hang-up or dry on the coating knife or die may cause issues with particle agglomeration and are generally not preferred.

The particles have a particle size range of 400 nanometers (nm) to 3000 nm, or a particle size range of 700 nm to 2.0 micrometers (microns). In this context, "particle size" refers to the longest dimension of a particle, which is the diameter of a spherical particle. A "particle size range" refers to a distribution of particle sizes from the smallest to the largest (not an average). Thus, the particles are not necessarily uniform in size. The particle size can be determined by scanning electron microscopy (SEM).

The particles may be of a variety of shapes, including polyhedron, parallelepiped, diamond, cylinder, arcuate, arcuate cylinder, rounded (e.g., oval or spherical or equiaxial), hemisphere, gumdrop, bell, cone, frusto conical cone, irregular, and mixtures thereof. In certain embodiments, the particles are spherical beads.

The polymeric film of the present disclosure includes a first polymeric layer having two major surfaces, wherein the first polymeric layer includes a first polymeric matrix and particles (preferably, polymeric particles) uniformly dispersed therein. The particles have a refractive index $n_2$ and the first polymeric matrix in which the particles are dispersed have a refractive index $n_1$, wherein $n_1$ is different than $n_2$. In certain embodiments, $n_1$ is at least 0.01 unit different than $n_2$. In certain embodiments, $n_1$ is at least 0.02 unit, or at least 0.03 unit, or at least 0.04 unit, or at least 0.05 unit different than $n_2$. In certain embodiments, $n_1$ is at most 0.5 unit different than $n_2$, In certain embodiments, $n_1$ is within 0.5 unit of $n_2$, $n_1$ is within 0.4 unit of $n_2$, $n_1$ is within 0.3 unit of $n_2$, $n_1$ is within 0.2 unit of $n_2$, or $n_1$ is within 0.1 unit of $n_2$. In this context "within" means within 0.5 unit (or 0.4 unit, or 0.3 unit, or 0.2 unit, or 0.1 unit) higher or lower.

Particles are preferably organic polymeric particles, but other particles may be used as well. Exemplary non-organic particles include $SiO_2$, $Al_2O_3$, $ZrO_2$, ZnO, and mixtures thereof. Exemplary organic polymers for use in the organic particles include an organic polymeric material selected from a silicone, such as a polydimethylsiloxane (PDMS), a polyurethane, a polymethyl methacrylate (PMMA), a polystyrene, or a combination thereof.

In certain embodiments, the particles are present in the first polymeric layer in an amount of less than 30 percent by volume (vol-%), based on the volume of the first polymeric layer. In certain embodiments, the particles are present in the first polymeric matrix in an amount of up to 25 vol-%, up to 20 vol-%, or up to 15 vol-%, based on the total volume of the first polymeric layer. In certain embodiments, the particles are present in the first polymeric matrix in an amount of at least 0.5 vol-% (or at least 1 vol-%), based on the total volume of the first polymeric layer.

Polymeric Matrices

A wide variety of polymers may be used in the polymeric matrices of the polymeric films of the present disclosure. Exemplary polymers for use in the polymeric matrices include silicones, acrylates, polyurethanes, polyesters, and polyolefins.

In certain embodiments, the polymeric matrices can be selected from a single-phase polymer matrix or a polymer matrix having a multiphase morphology. The multiphase morphology may be inherent in the choice of polymer matrix, such as for example, in a semi-crystalline polymer having both amorphous and crystalline domains, or may result from a polymer blend. Alternatively, the multiphase morphology may develop during drying or curing of the polymer matrix. Useful polymer matrices having multiphase morphology include those where each of the phases has the same refractive index or those where the refractive index is mismatched but the domain size of the dispersed phase does not exceed the size of the particles dispersed in the polymer matrix.

In certain embodiments, the polymeric matrices are adhesive matrices. In certain embodiments, at least one adhesive matrix includes an optically clear adhesive (OCA). In certain embodiments, the optically clear adhesive is selected from an acrylate, a polyurethane, a polyolefin (such as a polyisobutylene (PIB)), a silicone, or a combination thereof. Illustrative OCAs include those described in International Pub. No. WO 2008/128073 (3M Innovative Property Co.) relating to antistatic optically clear pressure sensitive adhesives, U.S. Pat. App. Pub. Nos. US 2009/089137 (Sherman et al.) relating to stretch releasing OCA, US 2009/0087629 (Everaerts et al.) relating to indium tin oxide compatible OCA, US 2010/0028564 (Cheng et al.) relating to antistatic optical constructions having optically transmissive adhesive, US 2010/0040842 (Everaerts et al.) relating to adhesives compatible with corrosion sensitive layers, US 2011/0126968 (Dolezal et al.) relating to optically clear stretch release adhesive tape, and U.S. Pat. No. 8,557,378 (Yamanaka et al.) relating to stretch release adhesive tapes. Suitable OCAs include acrylic optically clear pressure sensitive adhesives such as, for example, 3M OCA 8146 available from 3M Company, St. Paul, Minn.

For dual layer embodiments (see, e.g., FIG. 2), the polymeric layers may be the same material or they may be composed of two different materials. In either case, each polymeric layer may include a single-phase polymer matrix or may include a polymer matrix having a multiphase morphology.

In certain embodiments, a dual layer product construction (see, e.g., FIG. 2) may include one layer (layer 2 in FIG. 2) having particular optically diffusing properties and a second layer (layer 8 in FIG. 2) being an optically clear adhesive layer. Some of the benefits for forming a dual layer product construction would be to provide improved adhesive properties such as peel strength, robustness, coating integrity, etc. In cases where the dual layer product is incorporated into an OLED display device, the optically diffuse layer (layer 2 of the two layer system in FIG. 2) is preferably facing an OLED emissive display plane (e.g., the active-matrix organic light-emitting diode panel 10 in FIG. 3) and placed as close to that plane as the construction allows. For best performance, including contrast ratio and minimization of pixel blur, etc., the optically diffuse layer would be preferably in direct contact with an OLED encapsulation layer(s) (e.g., a combination of a barrier film 14 disposed on a first adhesive film 12 in FIG. 3). If not in direct contact, the performance may be degraded as the distance between the diffuse layer and emissive plane increases.

Display Devices

In certain embodiments, display devices of the present disclosure include: an organic light emitting diode panel having a multi-layer construction including one or more adhesive films; and a polymeric film as described herein incorporated within the multi-layer construction of the organic light emitting diode panel. In this context, in certain embodiments, "incorporated within the multi-layer construction" means that the polymeric film of the present disclosure replaces one or more adhesive films (e.g., optically clear adhesive films) of the multi-layer construction, particularly if the polymeric film includes an adhesive matrix. In this context, in certain embodiments, "incorporated within the multi-layer construction" means that the polymeric film of the present disclosure is incorporated into one or more adhesive films (e.g., optically clear adhesive films) of the multi-layer construction, particularly if the polymeric film itself does not include an adhesive matrix.

In certain embodiments, display devices include: an organic light emitting diode panel having a multi-layer construction including one or more adhesive films; and a polymeric film incorporated within the multi-layer construction of the organic light emitting diode panel. In such embodiments, the polymeric film includes a first polymeric layer having two major surfaces, wherein the first polymeric layer includes: a first polymeric matrix having a refractive index $n_1$; and particles having a refractive index $n_2$ uniformly dispersed within the first polymeric matrix. The particles are present in an amount of less than 30 vol-%, based on the volume of the first polymeric layer, and have a particle size range of 400 nm to 3000 nm.

In such embodiments, $n_1$ is different than $n_2$. In some embodiments, $n_1$ is at least 0.01 unit different than $n_2$. In some embodiments, $n_1$ is at least 0.02 unit, or at least 0.03 unit, or at least 0.04 unit, or at least 0.05 unit different than $n_2$. In some embodiments, $n_1$ is at most 0.5 unit different than $n_2$. In some embodiments, $n_1$ is within 0.5 unit of $n_2$, $n_1$ is within 0.4 unit of $n_2$, $n_1$ is within 0.3 unit of $n_2$, $n_1$ is within 0.2 unit of $n_2$, or $n_1$ is within 0.1 unit of $n_2$. In this context "within" means within 0.5 unit (or 0.4 unit, or 0.3 unit, or 0.2 unit, or 0.1 unit) higher or lower.

Significantly, in certain embodiments, a display device that includes a polymeric film of the present disclosure has an off-axis color shift (0-45°) that is at least 5% better (or at least 10% better, or at least 20% better, or at least 30% better) than an off-axis color shift compared to a display device that includes a non-diffusive optically clear adhesive in place of the polymeric film. In certain embodiments, a display device that includes a polymeric film of the present disclosure has an off-axis color shift (0-60°) that is at least 5% better (or at least 10% better, or at least 20% better, or at least 30% better) than an off-axis color shift compared to a display device that includes a non-diffusive optically clear adhesive in place of the polymeric film. In this context, a "non-diffusive" optically clear adhesive refers to an adhesive that is free of any light scattering particles or domains. Such an adhesive typically has a bulk haze of less than 0.5%.

Display devices of the present disclosure may be flexible or rigid. Examples of OLED displays that could incorporate the polymeric films of the present disclosure are described in U.S. Pat. App. Nos. US 2016/0001521 (Tanaka et al.), US 2014/0299844 (You et al.), and US 2016/0155967 (Lee et al.).

Figure 3:
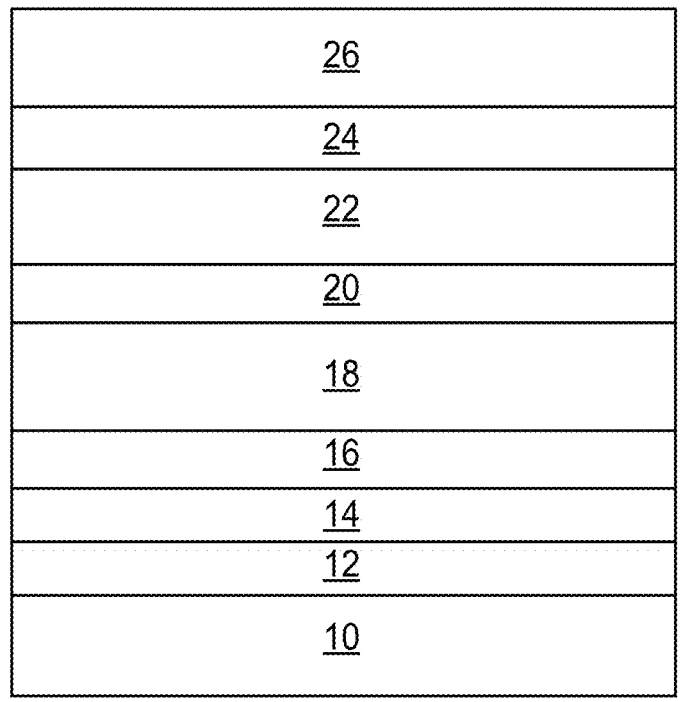
FIG. 3 is a cross-sectional representation of an organic light emitting diode panel having a multi-layered construction (layers are not to scale).

Exemplary devices include an organic light emitting diode panel having a multi-layered construction that includes, as shown in FIG. 3, an active-matrix organic light-emitting diode (AMOLED) panel 10; a first adhesive film 12 disposed on the active-matrix organic light-emitting diode panel 10; a barrier film 14 disposed on the first adhesive film 12; a second adhesive film 16 disposed on the barrier film 14; a circular polarizer 18 disposed on the second adhesive film 16; a third adhesive film 20 disposed on the circular polarizer 18; a touch panel 22 disposed on the third adhesive film 20; a fourth adhesive film 24 disposed on the touch panel 22; and a cover window 26 disposed on the fourth adhesive film 24. In certain embodiments, first adhesive film 12 includes an adhesive with good barrier properties like polyisobutylene. In certain embodiments, barrier film 14 is a conventional inorganic/organic multi-layer barrier film.

The display device of FIG. 3 is exemplary only of various multi-layered constructions. In certain embodiments, for example, barrier film 14 is incorporated into the AMOLED panel 10. In certain embodiments, first adhesive film 12 and barrier film 14 combined form a barrier against moisture and oxygen. In certain embodiments, touch panel 22 is incorporated into the AMOLED panel 10.

In certain multi-layer constructions, a polymeric film of the present disclosure includes at least one adhesive matrix. In such embodiments, such polymeric film can be the first adhesive film 12 (FIG. 3). In certain multi-layer constructions, a polymeric film of the present disclosure does not include an adhesive matrix. In such embodiments, such polymeric film can be incorporated within the first adhesive film 12 (FIG. 3).

In certain embodiments, the second, third, and/or fourth adhesive films (16, 20, 24 of FIG. 3) include (or is replaced by) a polymeric film of the present disclosure. In certain embodiments, the third and/or fourth adhesive films (20, 24 of FIG. 3) include (or is replaced by) a polymeric film of the present disclosure.

The adhesive films of the multi-layer construction shown in FIG. 3 that do not include a polymeric film include an optically clear adhesive as described above. In certain embodiments, first adhesive film 12 would typically have some barrier properties against moisture and oxygen.

Figure 4:
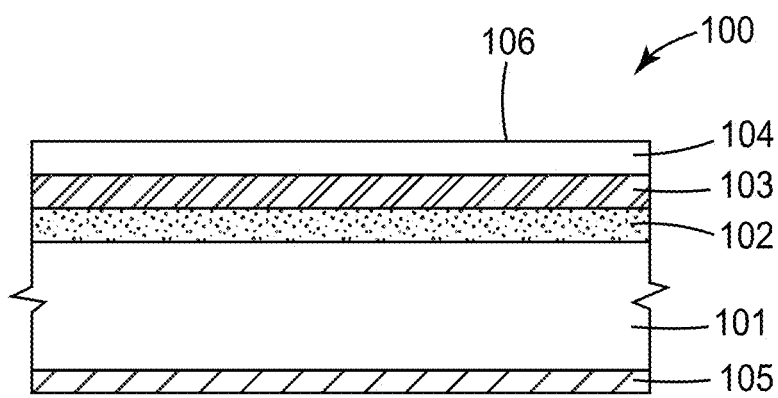
FIG. 4 is a cross-sectional representation of an exemplary active-matrix organic light-emitting diode panel (AMOLED panel).

In certain embodiments, the active-matrix organic light-emitting diode panel (10 of FIG. 3) includes an organic electroluminescent layer. For example, an exemplary active-matrix organic light-emitting diode panel (AMOLED panel) is shown in FIG. 4, and includes a driving substrate 101 in which a driving device array (e.g., a thin-film transistor (TFT) array) is arranged, an organic electroluminescent layer 102, a cathode electrode layer 103, and an encapsulation layer 104. A color filter layer (not shown) may be further arranged between the organic electroluminescent layer 102 and the encapsulation layer 104. A reflective layer 105 for reflecting light toward the encapsulation layer 104, that is, toward a light-emitting surface 106, may be provided under the driving substrate 101. Because the AMOLED panel is a self-emissive display panel in which the organic electroluminescent layer 102 generates light by using a driving signal, a separate light source (e.g., a backlight) may not be necessary.

In certain embodiments, a barrier film (14 of FIG. 3) includes an optical substrate such as COP (cyclic olefin polymer) or PET (polyethylene terephthalate) deposited with alternating layers of organic/inorganic materials that form an oxygen and moisture barrier. Examples of inorganic materials include silica, alumina, silicon carbide, and silicon nitride. An example includes a cured tricyclodecane dimethanol diacrylate and silica alternating layers). The organic layers are typically highly crosslinked acrylic materials.

Figure 5:
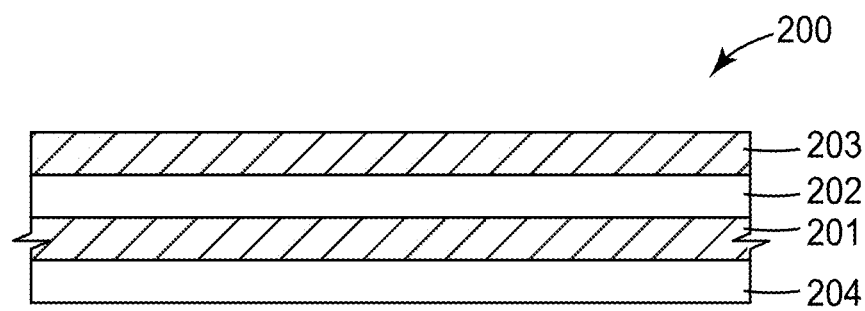
FIG. 5 is a cross-sectional representation of a circular polarizer according to an exemplary embodiment of the present disclosure.

An exemplary circular polarizer (18 of FIG. 3) is shown in FIG. 5, which is a cross-sectional view of the circular polarizer 200 according to an exemplary embodiment. Referring to FIG. 3, the circular polarizer 200 may include a linear polarizer 202, an upper support plate 203 and a lower support plate 201 that support the linear polarizer 202, and a quarter ($\lambda/4$) phase plate 204. The linear polarizer 202 may be, for example, a polyvinyl alcohol (PVA) film. The upper support plate 203 and the lower support plate 201 may be, for example, tri-acetyl-cellulose (TAC) films. The $\lambda/4$ phase plate 204 may be adhered to the lower support plate 201 by using an OCA layer. Exemplary embodiments are not limited to these types. The linear polarizer 202 linearly polarizes the external light L1. The $\lambda/4$ phase plate 204 circularly polarizes linearly polarized light and linearly polarizes circularly polarized light.

Figure 6:
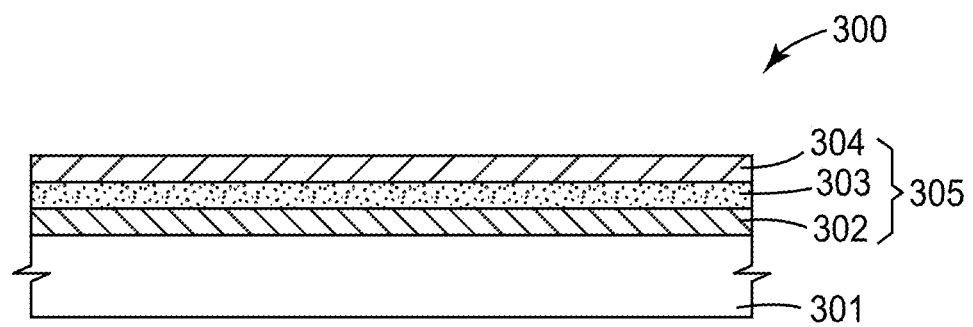
FIG. 6 is a cross-sectional representation of a capacitive touch panel according to an exemplary embodiment of the present disclosure.

In certain embodiments, a touch panel (22 of FIG. 3) includes a base substrate configured to transmit light and a touch electrode layer configured to receive a touch input. For example, FIG. 6 is a cross-sectional view of the touch panel 300 that is a capacitive touch panel according to an exemplary embodiment. The touch panel 300 is a manipulation unit that receives a user input. Resistive touch panels or capacitive touch panels are used in mobile devices. Referring to FIG. 6, the touch panel 300 may include a base substrate 301 that is a light-transmitting base substrate and a touch electrode layer 305 that is a light-transmitting touch electrode layer. The touch electrode layer 305 may include first and second electrode layers 302 and 304, and a dielectric layer 303 that is disposed between the first and second electrode layers 302 and 304.

The first electrode layer 302 may be formed by forming as a patterned thin film a conductive metal such as indium tin oxide (ITO), copper metal mesh, or silver nanowires on the base substrate 301 by using vacuum deposition, sputtering, or plating, etc. The dielectric layer 303 may be formed on the first electrode layer 302, and the second electrode layer 304 may be formed by forming as a patterned thin film a conductive metal on the dielectric layer 303 by using vacuum deposition, sputtering, or plating, etc. For example, the first electrode layer 302 may include a plurality of horizontal electrodes, and the second electrode layer 304 may include a plurality of vertical electrodes. Touch cells are formed at intersections between the horizontal electrodes and the vertical electrodes. The horizontal electrodes may be, for example, driving electrodes, and the vertical electrodes may be, for example, receiving electrodes. When a touching object, for example, a user's hand or a touch pen (e.g., stylus) approaches or contacts the touch panel 300, a change in a capacitance of a touch cell occurs. When a touch event occurs, a position of the touch cell may be detected by detecting the change in the capacitance. Also, the touch panel 300 may be formed so that the first and second electrode layers 302 and 304 are formed on a top surface and a bottom surface of the base substrate 301, respectively. Also, the touch panel 300 may be formed so that two substrates on which electrode layers are formed are bonded to each other. The touch panel 300 may be manufactured as a pliable light-transmitting film.

In certain embodiments, a cover window (26 of FIG. 3) includes a curved portion and/or a flat portion. The cover window may be made of a material selected from glass or an optically clear plastic. The cover window may allow an image that is displayed on the OLED panel to be seen therethrough, and may protect the OLED panel from external shock. Thus, the cover window is made of one or more transparent materials. The cover window may be formed of a rigid material, e.g., glass or plastics such as a polycarbonate or a polymethylmethacrylate. The cover window may be formed of a flexible material, e.g., plastics such as a polycarbonate or a polymethylmethacrylate.

EXEMPLARY EMBODIMENTS

Embodiment 1 is a polymeric film comprising: a first polymeric layer having two major surfaces, wherein the first polymeric layer comprises: a first polymeric matrix having a refractive index $n_1$; and particles (preferably, polymeric particles) having a refractive index $n_2$ uniformly dispersed within the first polymeric matrix; wherein the particles are present in an amount of less than 30 vol-%, based on the volume of the first polymeric layer, and have a particle size range of 400 nm to 3000 nm; and wherein $n_1$ is different than $n_2$ (in certain embodiments, $n_1$ is within 0.5 unit of $n_2$, $n_1$ is within 0.4 unit of $n_2$, $n_1$ is within 0.3 unit of $n_2$, $n_1$ is within 0.2 unit of $n_2$, or $n_1$ is within 0.1 unit of $n_2$); wherein the polymeric film has: a clarity of at least 80%; a visible light transmission of at least 85%; a bulk haze of 15% to 80% (preferably 20% to 80%, more preferably 30% to 70%, and even more preferably 30% to 50%); and a normalized micro-haze non-uniformity of not more than 12% across the polymeric film. In certain embodiments, such polymeric film is void-free (i.e., having less than 0.5 volume percent (vol-%) pores or voids).

Embodiment 2 is the polymeric film of embodiment 1 further comprising a second polymeric layer disposed on one major surface of the first polymeric layer; wherein the second polymeric layer comprises a second polymeric matrix having a refractive index $n_3$; wherein the first polymeric matrix and the second polymeric matrix are the same or different; and wherein at least one of the first polymeric matrix and the second polymeric matrix is an adhesive matrix.

Embodiment 3 is the polymeric film of embodiment 2 wherein the first polymeric matrix and the second polymeric matrix each comprises an adhesive matrix.

Embodiment 4 is the polymeric film of embodiment 3 wherein the first adhesive matrix and the second adhesive matrix comprise the same material.

Embodiment 5 is the polymeric film of embodiment 3 wherein the first adhesive matrix is different than the second adhesive matrix.

Embodiment 6 is the polymeric film of embodiment 2, 3, or 5 wherein $n_1$ is different than $n_3$ (preferably at least 0.05 unit different) and within 0.2 unit of $n_3$.

Embodiment 7 is the polymeric film of embodiment 6 wherein $n_1$ is within 0.1 unit of $n_3$. Embodiment 8 is the polymeric film of any of embodiments 1 to 7 wherein $n_1$ is different than $n_2$ (in certain embodiments, $n_1$ is at least 0.01 unit different than $n_2$, and in certain embodiments, at least 0.02 unit, or at least 0.03 unit, or at least 0.04 unit, or at least 0.05 unit different) and within 0.5 unit of $n_2$.

Embodiment 9 is the polymeric film of embodiment 8 wherein $n_1$ is within 0.2 unit of $n_2$. Embodiment 10 is the polymeric film of any of embodiments 1 to 9 wherein the particles have a particle size range of 700 nm to 2.0 microns.

Embodiment 11 is the polymeric film of any of embodiments 1 to 10 wherein the particles are present in the first polymeric matrix in an amount of at least 0.5 vol-%, based on the total volume of the first polymeric layer.

Embodiment 12 is the polymeric film of any of embodiments 1 to 11 wherein the particles are present in the first polymeric matrix in an amount of up to 25 vol-%, based on the total volume of the first polymeric layer.

Embodiment 13 is the polymeric film of embodiment 12 wherein the particles are present in the first polymeric matrix in an amount of up to 20 vol-%, based on the total volume of the first polymeric layer.

Embodiment 14 is the polymeric film of embodiment 13 wherein the particles are present in the first polymeric matrix in an amount of up to 15 vol-%, based on the total volume of the first polymeric layer.

Embodiment 15 is the polymeric film of any of embodiments 1 to 14 wherein the first polymeric layer has a thickness of at least 10 microns.

Embodiment 16 is the polymeric film of any of embodiments 1 to 15 wherein the first polymeric layer has a thickness of up to 100 microns.

Embodiment 17 is the polymeric film of embodiment 16 wherein the first polymeric layer has a thickness of up to 25 microns.

Embodiment 18 is the polymeric film of embodiment 17 wherein the first polymeric layer has a thickness of up to 15 microns.

Embodiment 19 is the polymeric film of any of embodiments 2 to 18 wherein the second polymeric layer has a thickness of at least 25 microns.

Embodiment 20 is the polymeric film of any of embodiments 1 to 19 wherein the polymeric film has a thickness of at least 35 microns.

Embodiment 21 is the polymeric film of any of embodiments 1 to 20 wherein the polymeric film has a thickness of up to 130 microns.

Embodiment 22 is the polymeric film of any of embodiments 2 to 21 wherein at least one adhesive matrix comprise an optically clear adhesive.

Embodiment 23 is the polymeric film of any of embodiments 1 to 22 wherein the particles comprise an organic polymeric material selected from a polydimethylsiloxane (PDMS), a polyurethane, a polymethyl methacrylate (PMMA), a polystyrene, or a combination thereof.

Embodiment 24 is the polymeric film of any of embodiments 2 to 23 wherein the first polymeric matrix and/or the second polymeric matrix comprise a multiphase morphology.

Embodiment 25 is a display device comprising: an organic light emitting diode panel having a multi-layer construction comprising one or more adhesive films; and a polymeric film of any of embodiments 1 to 24 incorporated within the multi-layer construction of the organic light emitting diode panel; wherein the polymeric film comprises at least one adhesive matrix.

Embodiment 26 is a display device comprising: an organic light emitting diode panel having a multi-layer construction comprising one or more adhesive films; and a polymeric film incorporated within the multi-layer construction of the organic light emitting diode panel; wherein the polymeric film comprises: a first polymeric layer having two major surfaces, wherein the first polymeric layer comprises: a first polymeric matrix having a refractive index $n_1$; and particles having a refractive index $n_2$ uniformly dispersed within the first polymeric matrix; wherein the particles are present in an amount of less than 30 vol-%, based on the volume of the first polymeric layer, and have a particle size range of 400 nm to 3000 nm; and wherein $n_1$ is different than $n_2$ (in certain embodiments, $n_1$ is within 0.5 unit of $n_2$, or $n_1$ is within 0.4 unit of $n_2$, or $n_1$ is within 0.3 unit of $n_2$, $n_1$ is within 0.2 unit of $n_2$, or $n_1$ is within 0.1 unit of $n_2$). In certain embodiments, such polymeric film is void-free (i.e., having less than 0.5 volume percent (vol-%) pores or voids).

Embodiment 27 is the display device of embodiment 26 further comprising a second polymeric layer disposed on one major surface of the first polymeric layer; wherein the second polymeric layer comprises a second polymeric matrix having a refractive index $n_3$; wherein the first polymeric matrix and the second polymeric matrix are the same or different; and wherein at least one of the first polymeric matrix and the second polymeric matrix is an adhesive matrix.

Embodiment 28 is the display device of embodiment 27 wherein the first polymeric matrix and the second polymeric matrix each comprises an adhesive matrix.

Embodiment 29 is the display device of embodiment 28 wherein the first adhesive matrix and the second adhesive matrix comprise the same material.

Embodiment 30 is the display device of embodiment 28 wherein the first adhesive matrix is different than the second adhesive matrix.

Embodiment 31 is the display device of any of embodiments 27, 28, and 30 wherein $n_1$ is different than $n_3$ (preferably at least 0.05 unit different) and within 0.2 unit of $n_3$.

Embodiment 32 is the display device of embodiment 31 wherein $n_1$ is within 0.1 unit of $n_3$.

Embodiment 33 is the display device of any of embodiments 26 to 32 wherein $n_1$ is different than $n_2$ (in certain embodiments, $n_1$ is at least 0.01 unit different than $n_2$, and in certain embodiments, at least 0.02 unit, or at least 0.03 unit, or at least 0.04 unit, or at least 0.05 unit different) and within 0.5 unit of $n_2$.

Embodiment 34 is the display device of embodiment 33 wherein $n_1$ is within 0.2 unit of $n_2$.

Embodiment 35 is the display device of any of embodiments 26 to 34 wherein the particles have a particle size range of 700 nm to 2.0 microns.

Embodiment 36 is the display device of any of embodiments 26 to 35 wherein the particles are present in the first polymeric matrix in an amount of at least 0.5 vol-%, based on the total volume of the first polymeric layer.

Embodiment 37 is the display device of any of embodiments 26 to 36 wherein the particles are present in the first polymeric matrix in an amount of up to 25 vol-%, based on the total volume of the first polymeric layer.

Embodiment 38 is the display device of embodiment 37 wherein the particles are present in the first polymeric matrix in an amount of up to 20 vol-%, based on the total volume of the first polymeric layer.

Embodiment 39 is the display device of embodiment 38 wherein the particles are present in the first polymeric matrix in an amount of up to 15 vol-%, based on the total volume of the first polymeric layer.

Embodiment 40 is the display device of any of embodiments 26 to 39 wherein the first polymeric layer has a thickness of at least 10 microns.

Embodiment 41 is the display device of any of embodiments 26 to 40 wherein the first polymeric layer has a thickness of up to 50 microns.

Embodiment 42 is the display device of embodiment 41 wherein the first polymeric layer has a thickness of up to 25 microns.

Embodiment 43 is the display device of embodiment 42 wherein the first polymeric layer has a thickness of up to 15 microns.

Embodiment 44 is the display device of any of embodiments 26 to 43 wherein the second polymeric layer has a thickness of at least 25 microns.

Embodiment 45 is the display device of any of embodiments 26 to 44 wherein the polymeric film has a thickness of at least 35 microns.

Embodiment 46 is the display device of any of embodiments 26 to 45 wherein the polymeric film has a thickness of up to 130 microns.

Embodiment 47 is the display device of any of embodiments 27 to 46 wherein the first polymeric matrix and/or the second polymeric matrix each comprise an optically clear adhesive.

Embodiment 48 is the display device of any of embodiments 26 to 47 wherein the particles comprise an organic polymeric material selected from a polydimethylsiloxane (PDMS), a polyurethane, a polymethyl methacrylate (PMMA), a polystyrene, or a combination thereof.

Embodiment 49 is the display device of any of embodiments 27 to 48 wherein the first polymeric matrix and/or the second polymeric matrix comprise a multiphase morphology.

Embodiment 50 is the display device of any of embodiments 25 to 49 (that includes a polymeric film of the present disclosure) having an off-axis color shift (0-45°) that is at least 5% better (or at least 10% better, or at least 20% better, or at least 30% better) than an off-axis color shift compared to a display device that includes a non-diffusive optically clear adhesive in place of the polymeric film.

Embodiment 51 is the display device of any of embodiments 25 to 50 (that includes a polymeric film of the present disclosure) having an off-axis color shift (0-60°) that is at least 5% better (in certain embodiments, at least 10% better, at least 20% better, or at least 30% better) than an off-axis color shift compared to a display device that includes a non-diffusive optically clear adhesive in place of the polymeric film.

Embodiment 52 is the display device of any of embodiments 25 to 51 which is flexible or rigid.

Embodiment 53 is the display device of any of embodiments 25 to 52 wherein the organic light emitting diode panel comprises a multi-layered construction comprising: an active-matrix organic light-emitting diode panel; a first adhesive film disposed on the active-matrix organic light-emitting diode panel; a barrier film disposed on the first adhesive film; a second adhesive film disposed on the barrier film; a circular polarizer disposed on the second adhesive film; a third adhesive film disposed on the circular polarizer; a touch panel disposed on the third adhesive film; a fourth adhesive film disposed on the touch panel; and a cover window disposed on the fourth adhesive film; wherein at least one of the adhesive films comprises the polymeric film.

Embodiment 54 is the display device of embodiment 53 wherein the first, second, third, and/or fourth adhesive films comprises the polymeric film.

Embodiment 55 is the display device of embodiment 53 or 54 wherein the adhesive film that does not include the polymeric film comprises an optically clear adhesive.

Embodiment 56 is the display device of any of embodiments 53 to 55 wherein the active-matrix organic light-emitting diode panel comprises an organic electroluminescent layer.

Embodiment 57 is the display device of any of embodiments 53 to 56 wherein the barrier film comprises an optical substrate such as COP (cyclic olefin polymer) or PET (polyethylene terephthalate) deposited with alternating layers of organic/inorganic materials that forms an oxygen and moisture barrier.

Embodiment 58 is the display device of any of embodiments 53 to 57 wherein the polymeric film is compatible with the circular polarizer.

Embodiment 59 is the display device of any of embodiments 53 to 58 wherein the touch panel comprises a base substrate configured to transmit light and a touch electrode layer configured to receive a touch input.

Embodiment 60 is the display device of any of embodiments 53 to 59 wherein the cover window comprises a curved portion and/or a flat portion.

Embodiment 61 is the polymeric film or display device of any of embodiments 1 to 60 wherein the first polymeric matrix comprises an acrylate, a polyurethane, a polyolefin (such as a polyisobutylene (PIB)), a silicone, or a combination thereof. Embodiment 62 is the polymeric film or display device of embodiment 61 wherein the first polymeric matrix comprises a polyolefin.

Embodiment 63 is the polymeric film or display device of embodiment 62 wherein the first polymeric matrix comprises polyisobutylene.

EXAMPLES

Objects and advantages of this invention are further illustrated by the following examples, but the particular materials and amounts thereof recited in these examples, as well as other conditions and details, should not be construed to unduly limit this invention. These examples are merely for illustrative purposes only and are not meant to be limiting on the scope of the appended claims.

Materials

| Designation | Description | Source |
| --- | --- | --- |
| PH-56 | Polyester Polyol Mw = 2000, under trade designation STEPANPOL PH-56 | Stepan Company, Northfield, IL |
| ACM | Acrylamide | Parchem, New Rochelle, NY |
| HDI | Hexamethylene diisocyanate, under the trade name DESMODUR H | Bayer Materials Science LLC, Pittsburgh, PA |
| MEK | Methyl ethyl ketone, solvent | Avantor Performance Materials, Inc Center Valley, PA |
| DBTDA | Dibutyltin diacetate | Sigma-Aldrich, St. Louis, MO |
| DMPA | 2,2-Bis(hydroxymethyl)propionic acid | Sigma-Aldrich, St. Louis, MO |
| BAGM | Bisphenol A-glycidyl methacrylate | Sigma-Aldrich, St. Louis, MO |
| EHA | 2-Ethylhexyl acrylate | BASF, Florham Park, NJ |
| BA | n-Butyl acrylate | BASF, Florham Park, NJ |
| HEA | 2-Hydroxyethyl acrylate | BASF, Florham Park, NJ |
| HDDA | 1,6-Hexandiol diacrylate | BASF, Florham Park, NJ |
| iBOA | Isobornyl acrylate | Osaka chemical company, JP |
| CN104 | Epoxy acrylate oligomer | Sartomer, Exton, PA |
| KBM-403 | 3-Glycidoxypropyl trimethoxysilane | Shin-Etsu silicones of America, INC, Akron, Ohio |
| RF02N | Silicone coated polyester release liner | SKC Haas (Cheonan, Korea) |
| RF12N | Silicone coated polyester release liner | SKC Haas (Cheonan, Korea) |
| RF22N | Silicone coater polyeser release liner | SKC Haas (Cheonan, Korea) |
| RF52N | Silicone coated polyester release liner | SKC Haas (Cheonan, Korea) |
| D-1173 | 2-Hydroxy-2-methyl-1-phenyl-propan-1-one | BASF, Florham Park, NJ |
| TPO | 2,4,6-Trimethyl benzoyl-triphenyl oxide | BASF, Florham Park, NJ |
| IRGACURE 651 | Alpha,alpha-dimethoxy-alpha-phenylacetophenone | BASF, Florham Park, NJ |
| VAZO 67 | 2,2'-Azobis(2-methylbutyronitrile) | E.I Du Pont de Nemours and Company, Wilmington, Delaware |
| IRGACURE 819 | Phosphine oxide, phenyl bis (2,4,6-trimethyl benzoyl) | BASF, Florham Park, NJ |
| TOSPEARL 120A | Silicone beads (2.0 microns, monodispersed) | Momentive Performance Materials, Waterford, NY |
| TOSPEARL 145 | Silicone beads (4.5 microns, monodispersed) | Momentive Performance Materials, Waterford, NY |
| OPPANOL B10 | Medium molecular weight polyisobutylene | BASF, Florham Park, NJ |

Test Methods

Optical Property Test Methods: Bulk Haze, Transmission, Clarity and Refractive Index Basic optical properties including transmission, bulk haze, and clarity values were measured using a Haze-Guard Plus haze meter (commercially available from BYK-Gardner, Columbia, Md.). Refractive indices of these films were measured using a Metricon Model 2010 Prism Coupler (available from Metricon Corp., Pennington, N.J.). This instrument samples the optical film with rather large area beam (18 millimeter (mm) diameter) to average over considerable area of display surface.

Optical Property Test Method: Micro-Haze Uniformity

Haze can be measured on a small lateral scale by focusing a probe beam onto the surface of the sample such that the focused spot is, for example, on the order of 10 micrometers or less. This approach of interrogating a small area of the sample is referred to herein as micro-haze. The micro-haze measurement technique allows sample analysis for spatial frequencies corresponding to the peak for human vision perception and on the length scale of the display pixels. Standard haze measurement systems analyze a large area of the optical film and do not show differences on the critical length scales for pixelated displays.

Figure 7:
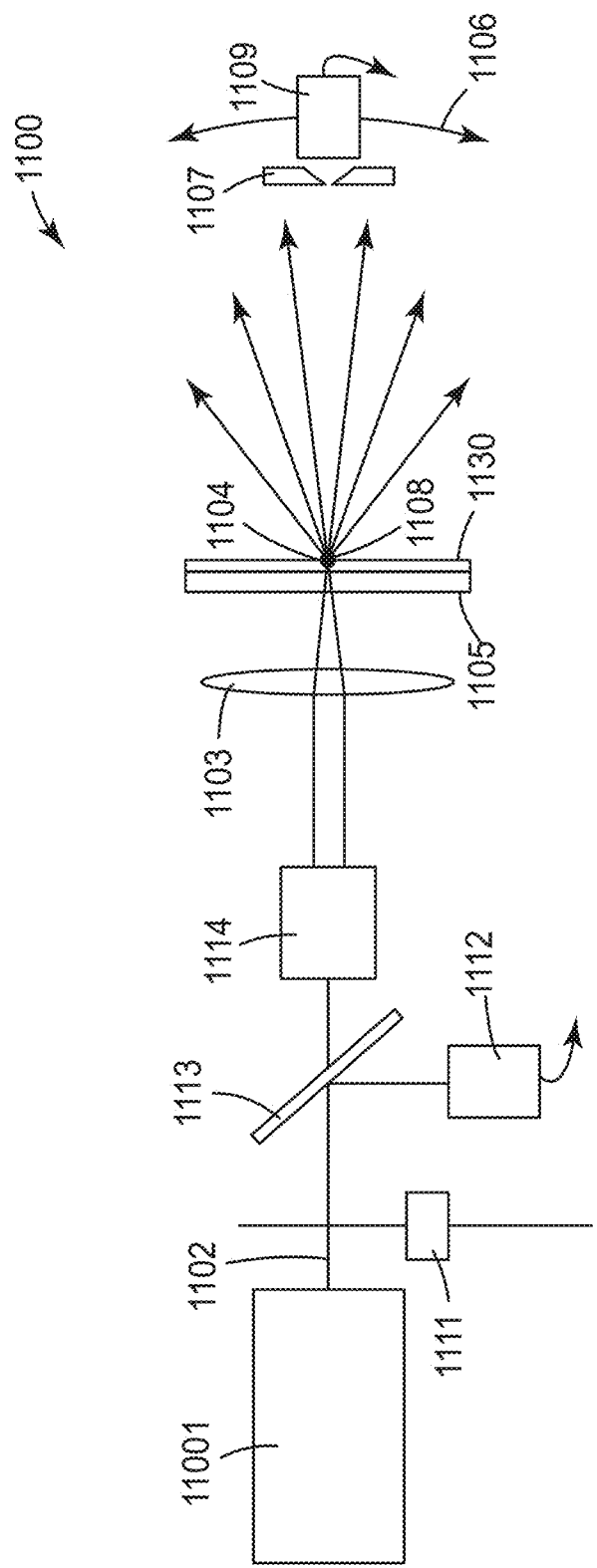
FIG. 7 is a representation of a microscatterometry system used to determine the micro-haze of polymeric optical films.

The microscatterometry system used to determine the micro-haze of polymeric optical films is shown in FIG. 7. Referring to FIG. 7, microscatterometry system 1100 included laser light source 1101 (obtained from Melles Griot, Carlsbad, Calif., as Model 85-GCB-020, 532 nm 20 mW DPSS laser), optical chopper (for chopping the light beam) 1111 (obtained under the trade designation "NEW FOCUS 3501 OPTICAL CHOPPER" from Newport Corporation, Irvine, Calif.), light beam splitter 1113 (obtained under the trade designation "UV FUSED SILICA METALLIC NEUTRAL DENSITY FILTER FQR-ND01" from Newport Corporation), second light detector 1112 (obtained under the trade designation "NEW FOCUS LARGE-AREA PHOTORECEIVER," Model 2031, from Newport Corporation), beam expanding spatial filter (filtering and expanding the light beam) 1114 (obtained under the trade designation "COMPACT FIVE-AXIS SPATIAL FILTER MODEL 910A" from Newport Corporation used with collimating lens achromatic doublet (1 inch diameter, 50.8 mm focal length) obtained under the under the trade designation "PAC040" from Newport Corporation), focusing lens 1103 (obtained under the trade designation "PAC058 ACHROMATIC DOUBLET" (1 inch diameter, 150 mm focal length from Newport Corporation)), sample holder 1105 (a spring loaded mount (obtained under the trade designation "M-PPF50" from Newport Corporation)), sample to be tested 1130, variable aperture 1107 (obtained under the trade designation "COMPACT ADJUSTABLE WIDTH SLIT M-SV-0.5" from Newport Corporation), first light detector 1109 (obtained under the trade designation "NEW FOCUS LARGE-AREA PHOTO RECEIVER," Model 2031, from Newport Corporation) rotatable (1106) from at least −90° to 90° about eucentric point 1108 in a plane parallel to the ground, and −45° to 45° about the same eucentric point 1108 in an orthogonal plane.

Other components of the microscatterometry system included a linear translation stage (obtained under the trade designation "MFA-1C" from Newport Corporation), detector stages (obtained under the trade designation "ROTATION STAGE RV350PE" from Newport Corporation), goniometric stage (obtained under the trade designation "GONIOMETRIC STAGE BGM 160 PE" from Newport Corporation), stage drivers (for sample and detector stages (obtained under the trade designation "UNIVERSAL MOTION CONTROLLER ESP300" from Newport Corporation)), and detection electronics (obtained under the trade designation "ANALOG-TO-DIGITAL CONVERTER NI 9215, CDAQ 9172 CHASSIS" from National Instruments, Austin, Tex.).

When light source 1101 was energized, light beam 1102 passed through and was focused by focusing lens 1103 to a spot having a 10-micrometer spot diameter focused at eucentric point 1108. The focused light diverged after focal point 1104. The diverging light passed through aperture 1107 before contacting first light detector 1109. Sample holder 1105 translated in a plane orthogonal to the incident light beam 1102. Light beam splitter 1113 was used to split light beam 1102 to second light detector 1112. Light beam splitter 1113 transmitted about 90% of light beam 1102 towards focusing element 1103 and reflected about 10% of light beam 1102 towards second detector 1112. Second detector 1112 was used to monitor variations in the intensity of light beam 1102 coming from light source 1101. The signal from first detector 1109 was divided by the signal from second detector 1112, to account for variations in the intensity of light beam 1102.

During operation sample holder 1105 translated such that a portion of sample holder 1105 remained at eucentric point 1108, and rotated about eucentric point 1108.

During operation, first light detector 1109 rotated (1106) about eucentric point 1108 and collected data generated by the scattered light passing through aperture 1107 onto first light detector 1109.

A probe wavelength of 532 nanometers (nm) was used to obtain the approximately 10-micrometer focused spot diameter by using a 154-mm focal length lens using the diameter of an Airy disc (spot diameter=2.44×wavelength×focal length/beam diameter).

The sample was physically scanned relative to the focused spot to take measurements across the film surface and gather statistics for micro-haze uniformity. For each angular position of the first light detector with respect to the in-line direction, the light transmitted through the sample was measured as a function of position across the sample. The measurement at each lateral position took 1 second. In this way, the angular spectrum of scattered light was obtained for each lateral position of interest on the sample. The angle subtended by the first light detector at each angular measurement position was 0.2° in the measurement plane and 0.85° normal to the measurement plane. From these angular scatter light intensities the light intensity proportional to the direct beam (the beam diverging from the focused spot with the same angle as the convergence angle of the original incident beam) and the light intensity proportional to the scattered beam are calculated. The direct beam measurement included light between 0° and 5.8° (the angle between the optic axis and the edge of the direct beam, determined by measuring the beam with no sample in place). The scattered beam measurement included the light projecting between 5.8° to 15.8° (representative of light scattered out of the direct beam into the first 10° adjacent to the direct beam). From these two values the fractional micro-haze was calculated. This is defined as the ratio of scattered beam intensity to the sum of scattered plus transmitted direct beam. Normalizing in this way negates the effects of absorption and front surface reflections from the micro-haze calculation.

During the measurement, the beam was physically chopped at around 2.04 kHz and both the detected signal and the source laser intensity were measured with a lock-in amplifier. This chopping frequency was in the low noise and flat frequency response range of the photodetectors. Lock-in detection enabled intensity measurements over more than 4 orders of magnitude, which is helpful when making measurements of low haze samples, where there is a large difference in the intensities of the direct beam and scattered beam. The micro-haze uniformity is defined as the standard deviation of the fractional micro-haze divided by the mean fractional micro-haze measurement itself. In this way, the micro-haze uniformity metric is functionally a noise-to-signal ratio.

OLED Color Shift Test Method

Figure 8:
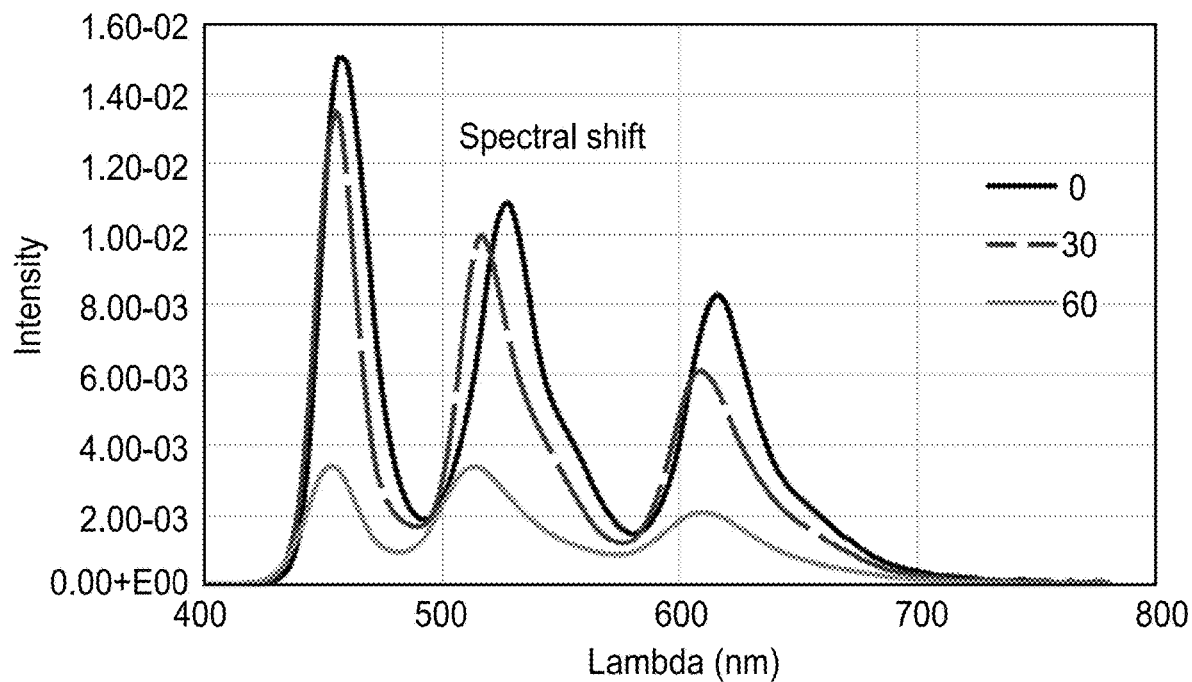
FIG. 8 is an optical spectrum of an exemplary film of the present disclosure for 3 different viewing angles.

The angular color of a strong-cavity OLED device, commonly used in mobile phones, has a blue shift as the viewing angle increases. This effect is commonly referred to as off-angle color shift or angular color non-uniformity. The optical spectrum at three (3) selected viewing angles of a Samsung S5 mobile phone is illustrated in FIG. 8. The spectrum shows three (3) spectral peaks. Although the overall spectrum demonstrates a clear trend of shifting to shorter wavelength as the viewing angle increases, many other spectral parameters also vary—the spectral weights of the three distinct peaks change and the relative shift of each spectral peaks are different from each other.

As a figure of merit for the off-angle color shift, it is common to represent the color shift from the corresponding shift in CIE (Commission on Illumination) color coordinates. The CIE color coordinates (u,v) are measures for differing angles and the metric for color shift can be represented by delta_u'v' as expressed in equation A.

$$\text{delta\_}u'v'=\{[u'(\theta)-u'(0)]^2+[v'(\theta)-v'(0)]^2\}^{0.5}; \quad (A)$$

The sample measurement method for OLED color shift utilized a Samsung S5 OLED mobile phone; the same Samsung S5 was used as the testbed for each of the diffuse adhesive samples in the comparison. One intended use of the moderately diffusing polymeric film is to incorporate into the OLED layers, preferably directly above the OLED pixels or above the TFE layer (thin film encapsulation). For this test, however, it is considered equivalent to measure color shifts and brightness with the polymeric film samples placed proximate but outside of the OLED device assembly. More specifically, samples were placed immediately above the touch panel display.

After mounting the samples onto the OLED device assembly, a blank white image was then displayed on the OLED screen. Next, the OLED panel assembly was mounted on a rotation stage to enable angular adjustment relative to the measuring spectrophotometer. For this test system, a PR650 spectrophotometer (PhotoResearch Inc., Syracuse, N.Y.) was used to measure the color and luminance intensity of the testing assembly at every 5 degree incremental rotation angle.

Figure 9:
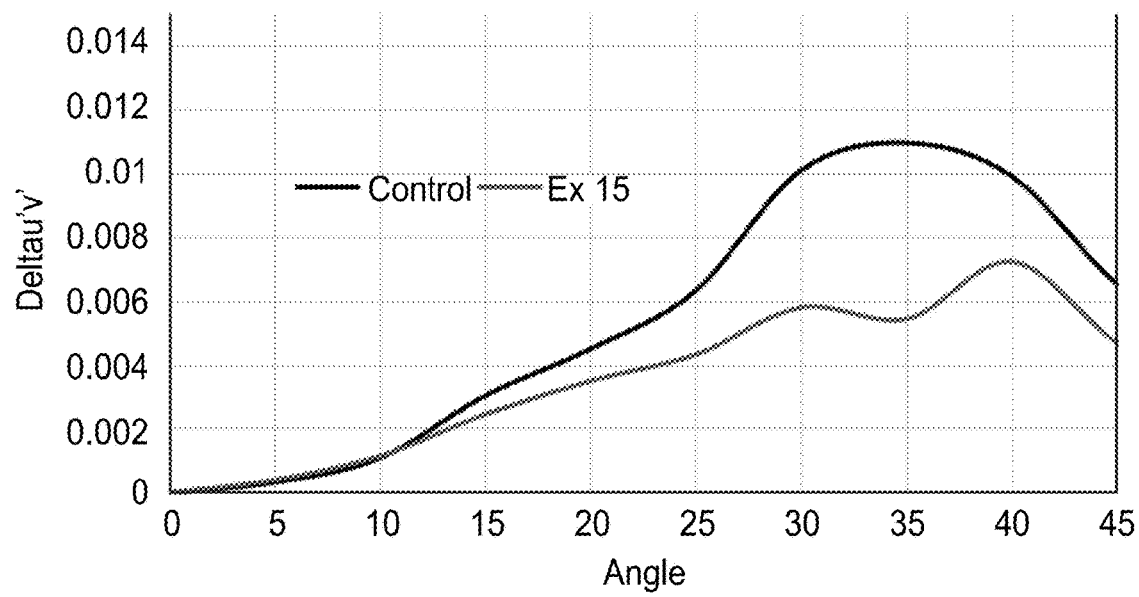
FIG. 9 is an exemplary plot of off-angle color shift (as represented by the corresponding shift in CIE (Commission on Illumination) color coordinates) versus viewing angle with and without a Wide View Color (WVC) correction polymeric film.

For each sample in this evaluation, the angular color shift (delta_u'v') of the OLED device with a Wide View Color (WVC) correction polymeric film was plotted and compared to the same OLED without a WVC correction polymeric film (control). An exemplary plot is shown in FIG. 9. The WVC correction polymeric film helps to substantially reduce the angular color shift of the OLED device. The maximum color shift from 0-45 degrees was reduced from delta_u'v'=0.012 (control) to delta_u'v'=0.07 (with polymeric film), representing a 40% reduction.

OLED Dark State Reflectivity Test Method

Figure 10:
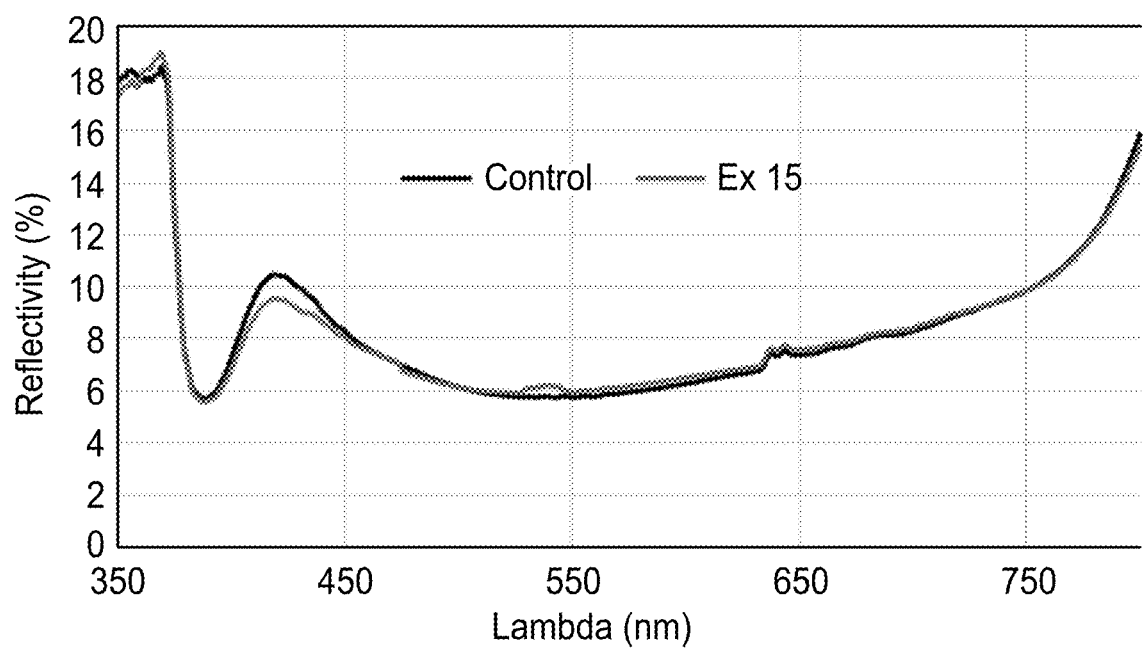
FIG. 10 is a plot of Samsung S4 specular reflectivity measured by Lambda900 with and without a WVC correction polymeric film (essentially no change in ambient reflectivity).

A mobile OLED device normally has strong specular reflection from electrode elements. To mitigate this problem, most assemblies incorporate a circular polarizer at the front surface to reduce ambient light reflection. Preferably the polymeric material incorporated into the OLED device should not depolarize and increase the ambient light reflection. For the typical OLED display system, including a circular polarizer element, it is desirable that the photopic reflectivity should not increase by more than 5% with the incorporation of the polymeric film for Wide View Color correction. To illustrate this, the specular reflectivity of the OLED device with circular polarizer was measured with and without a WVC correction polymeric film. (This particular polymeric film is later described as Example 15.) These reflectivity measurements were made with Lambda900 spectrophotometer (Perkin Elmer, Waltham, Mass.) over the wavelength range of 350 nm to 800 nm. The resulting reflectivity measurements, with and without the WVC correction polymeric film, are shown (FIG. 10) to have essentially no change in ambient reflectivity with the addition of the diffusing polymeric film. Thus, a WVC correction film of the present disclosure is compatible with a circular polarizer. By "compatible" it is meant that no more than 5% of the light is depolarized by a WVC correction polymeric film in an OLED display system.

Optical Property Modelling Method: Bulk Haze, Transmission and Clarity

Figure 11:
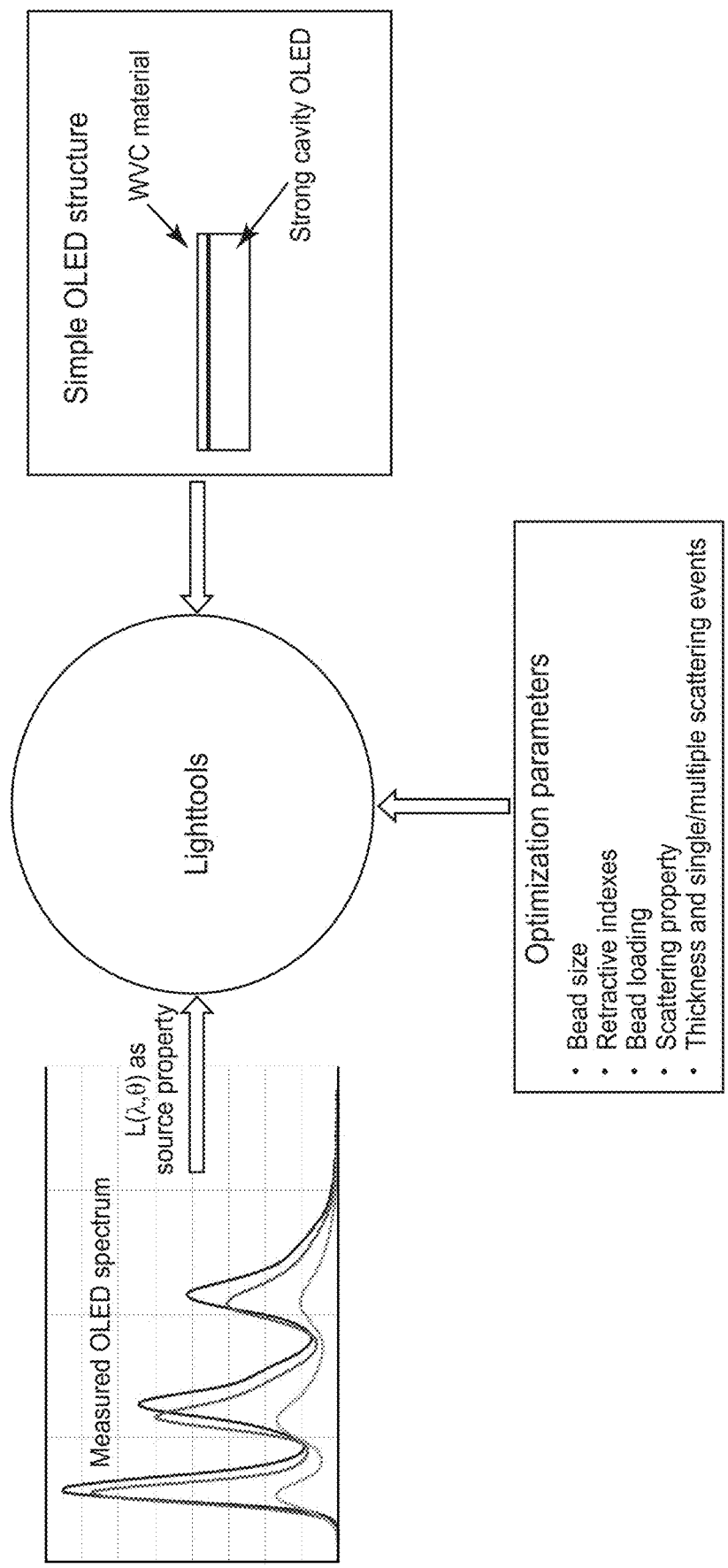
FIG. 11 is a representation of an exemplary OLED diffuser design and optimization process.

In order to understand the range of design parameters that can give rise to good device performance, optical simulation examples were compiled to measure and report critical "in device" metrics including Bulk Haze, Transmission, Clarity, Axial Brightness, and Angular Color Uniformity. To conduct this study, a commercially available optical software system available under the tradename LIGHT TOOLS (Synopsys, Mountain View, Calif.) was utilized for the OLED polymeric film design and optimization. The design and modelling process is illustrated schematically in FIG. 11. The experimentally measured OLED spectrum (see FIG. 11) as input to the simulation program was the starting point. The simple OLED structure modeled with LIGHT TOOLS optical simulation software includes a strong cavity OLED, and the diffuse polymeric layer (see FIG. 11).

The modeled examples were chosen to reflect the particular optimization parameters for the diffusing polymeric film. These parameters included scattering particle (e.g., bead) size, particle loading as a fraction of volume, refractive indices of particles and resin, and layer thickness. As the following modelling results demonstrate these parameters for optimal WVC correction polymeric film are strongly interdependent.

Figure 12:
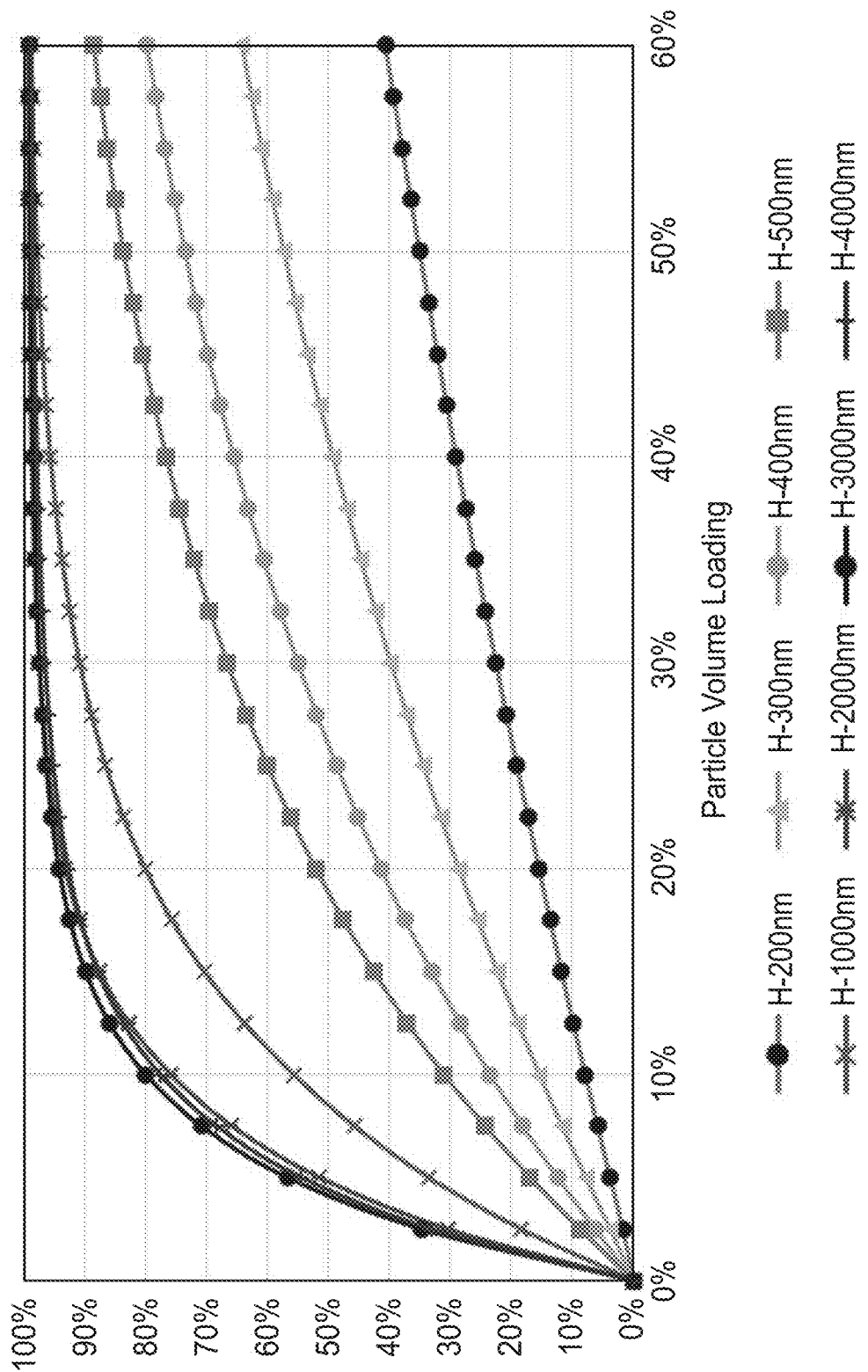
FIG. 12 is a plot of modeled bulk haze as a function of particle volume loading at different particle diameter.

Bulk haze, as a function of particle volume loading at different particle diameters, is illustrated in FIG. 12 representing data collection of Examples and Comparative Examples 28-75. The corresponding discrete values are tabulated in Table 10. Target bulk haze levels for suitable polymeric films is desirably 15% to 80% (preferably 20% to 80%, more preferably 30% to 70%, and even more preferably 30% to 50%) to satisfy both pixel blur issues and provide substantive improvement in color shift. Commensurately, the useful particle loading levels in the resin was desirably less than 30%. In this particular simulation set, the polymeric film thickness was specified to be 20 µm, refractive index of the particles was 1.42, and the refractive index of the resin was 1.49. FIG. 12 shows results for this simulation for bead diameters of 200 nm, 300 nm, 400 nm, 500 nm, 1000 nm, 2000 nm, 3000 nm, and 4000 nm diameters. From data plotted in FIG. 12, one may observe that the target for bulk haze greater than 50%, with a volume loading of less than 50%, requires a particle (e.g., bead) size of greater than about 300 nm. When the particle size is smaller than 300 nm, the volume loading needs to be extraordinarily high and practical dispersions are difficult.

Figure 13:
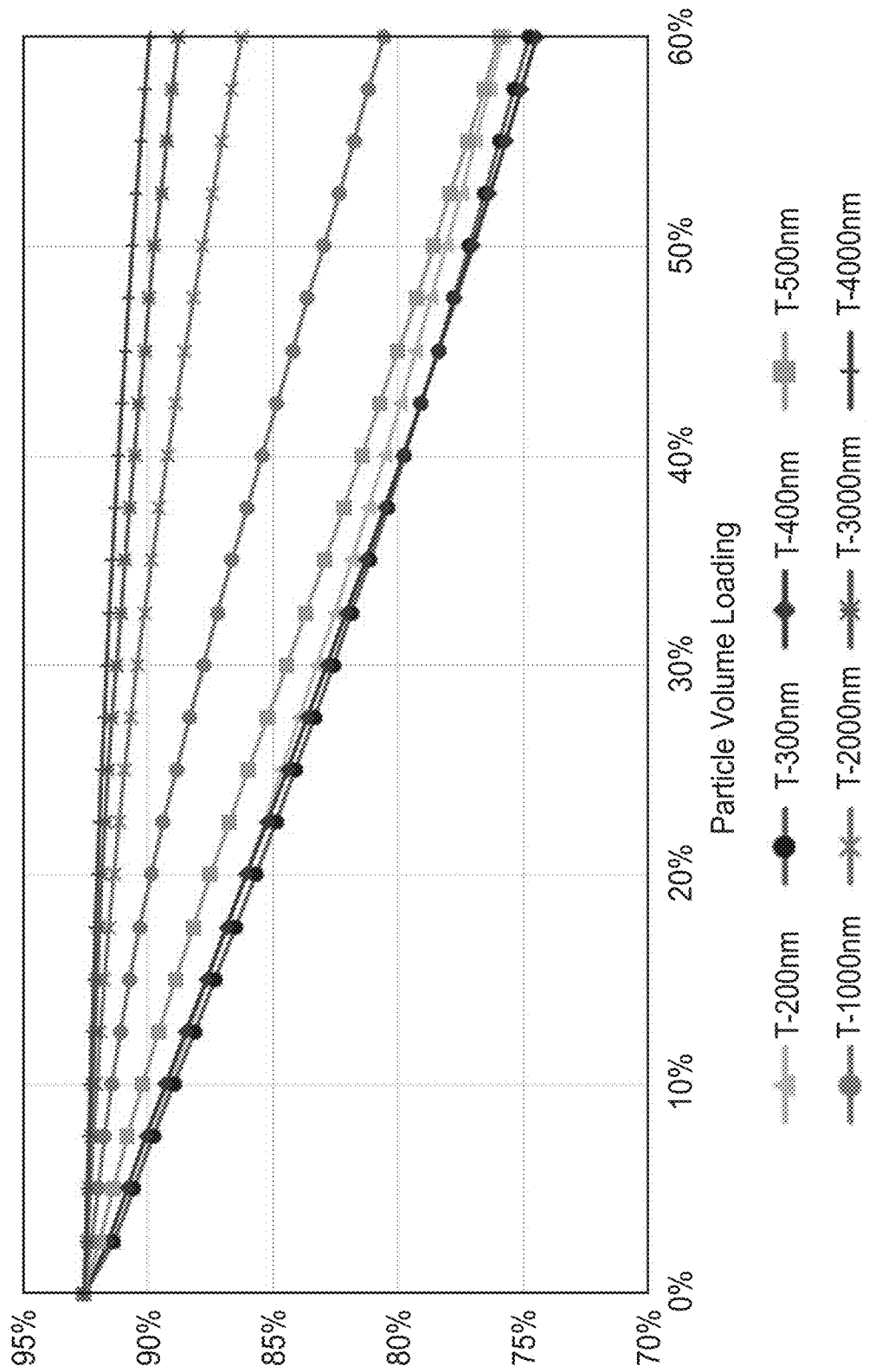
FIG. 13 is a plot of modeled transmission as a function of particle volume loading at different particle diameter.

Sample transmission was also modeled as a function of particle size and volume loading for the polymeric film. The results of transmission versus particle volume loading are plotted in FIG. 13, which shows simulated results for particle (e.g., bead) sizes of 200 nm, 300 nm, 400 nm, 500 nm, 1000 nm, 2000 nm, 3000 nm, and 4000 nm diameters. FIG. 13 shows data collection from Examples and Comparative Examples 28-75. The corresponding discrete values are tabulated in Table 10. For a given particle loading, the transmission decreases significantly as the particle size gets smaller. For example, at particle loading of 50%, the transmission for particle sizes of 2000 nm and above remained greater than 85%, whereas the transmission for particle sizes of less than 400 nm diameter dropped below 80%. This lower transmission of the material, in turn, reduces the OLED brightness significantly. Thus, visible light transmission (also referred to herein as simply "transmission") for a polymeric film is desirably at least 85%, and preferably at least 90%.

Figure 14:
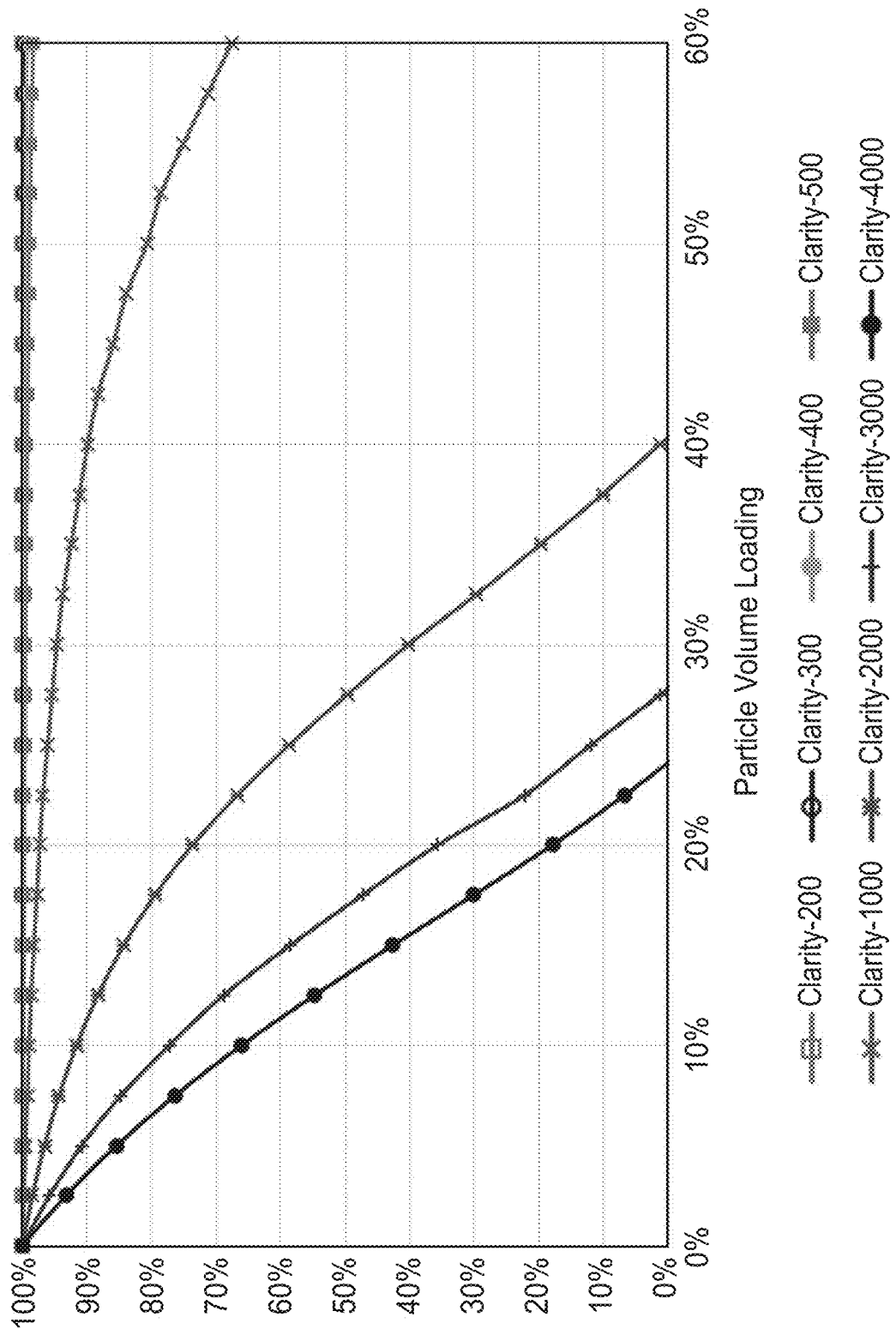
FIG. 14 is a plot of modelling results for clarity as a function of particle size and loading.

The material clarity for the polymeric film relates to pixel blur for the underlying display. The clarity for acceptable pixel blur is desirably at least 80%, and preferably at least 90%. Modelling results for clarity as a function of particle size and loading are shown in FIG. 14 representing data collection of Examples and Comparative Examples 28-75. The corresponding discrete values are tabulated in Table 10. At a given particle loading, the material clarity decreases as the particle size gets larger. For example, at 30% particle loading, the clarity for particle sizes of less than 1000 nm remains above about 95%, whereas for particle sizes of greater than 2000 nm the clarity falls below 40%.

Figure 15:
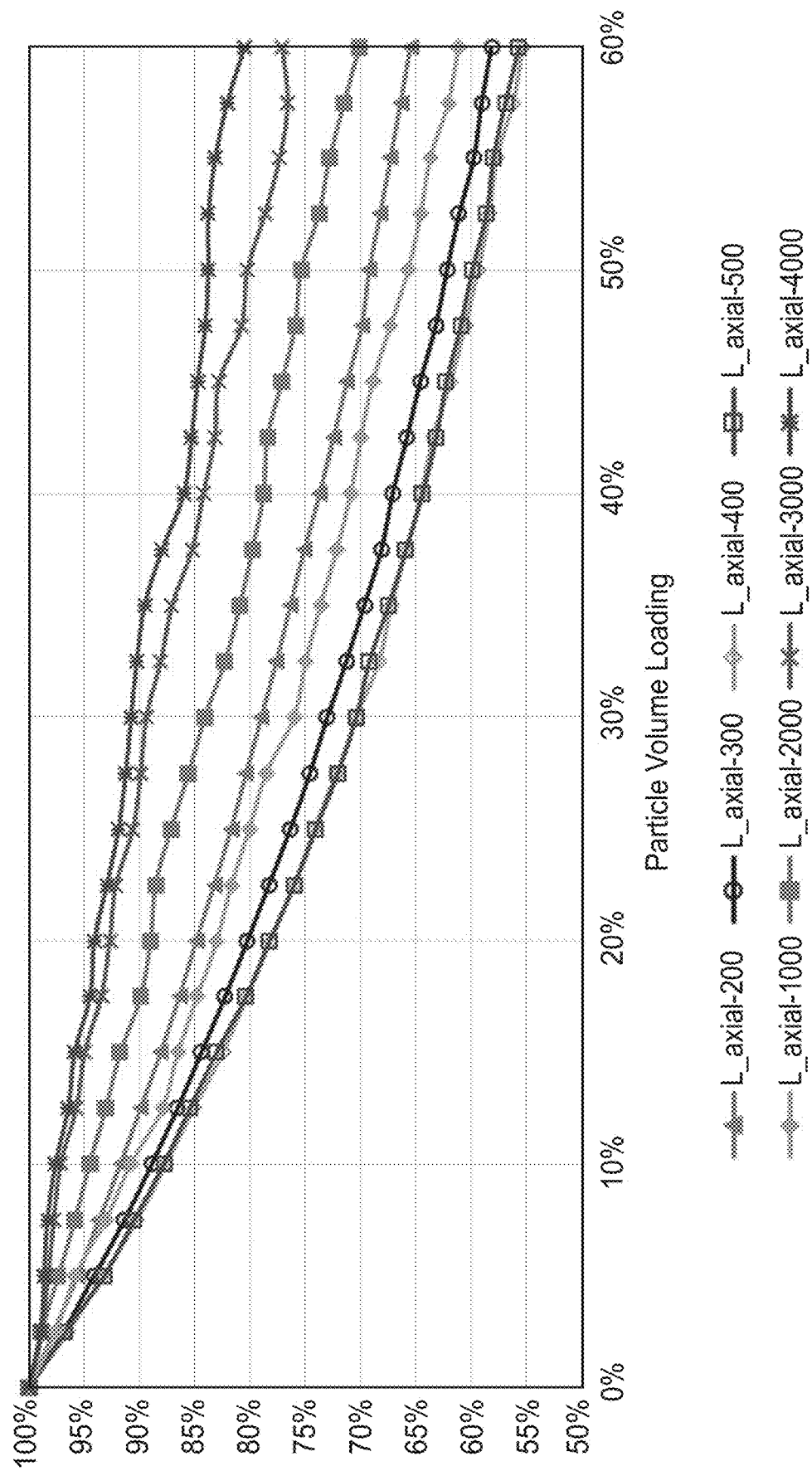
FIG. 15 is a plot of modeled axial brightness for an OLED device as a function of particle size and loading for polymeric film.

When the polymeric film is integrated into an OLED device, the optical performance of the device simulations may also yield information about the axial brightness metric (which correlates to transmission, haze, and clarity). The axial brightness of the OLED device as a function of particle size and loading is illustrated in FIG. 15 representing data collection of Examples and Comparative Examples 28-75. The corresponding discrete values are tabulated in Table 10. In general, either larger particle sizes or very small particle sizes give rise to better axial brightness. Since the very small particle sizes have proven ineffective to scatter light for color uniformity, the axial brightness consideration shows particle sizes of greater than 500 nm are preferable.

Figure 16:
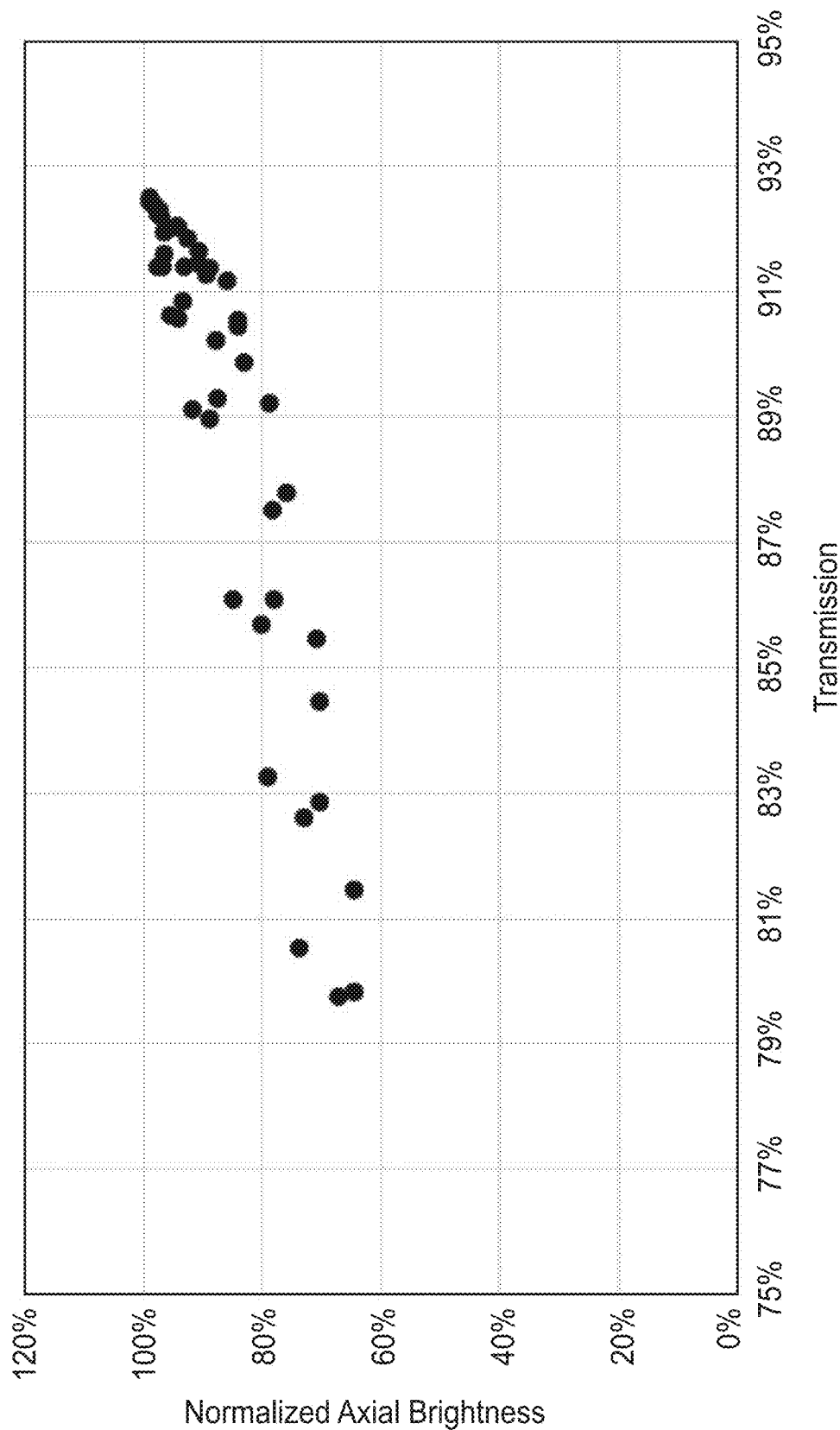
FIG. 16 is a scatterplot showing correlation between simulated normalized axial display brightness versus simulated transmission for polymeric films of Examples 28-75.

The axial brightness of the OLED device is affected mostly by the transmission and haze of the polymeric film. The transmission of the film has the strongest influence. The larger the transmission, the better the axial brightness. A scattered plot of simulated OLED axial brightness vs the transmission of the polymeric film is illustrated in FIG. 16 for polymeric films of Examples 28-75.

Figure 17:
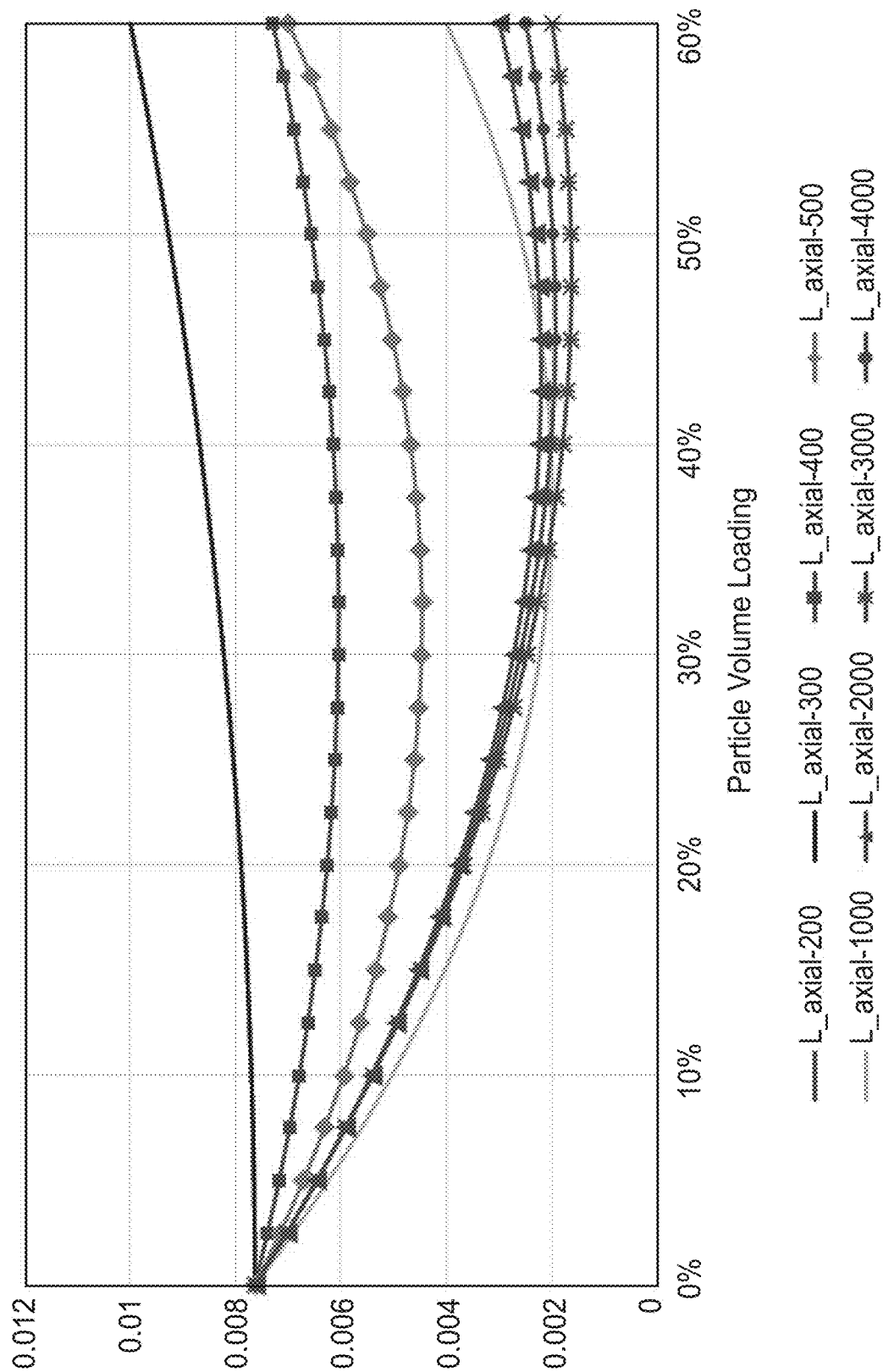
FIG. 17 is a plot of modelling results for a maximum OLED color shift within 45 degree view angle.

The primary device performance metric for this modelling exercise is the angular color shift (delta (u',v')). For the purpose of illustrating the device color shift over the same ranges of particle size (200-4000 nm) and volume loading (0-40%), the polymeric film material thickness was 20 μm, the refractive index of the particles was 1.42, and the refractive index of the resin was 1.49 (measured at green wavelength of lambda=550 nm). The maximum color shift within a 45 degree range was plotted in FIG. 17. The corresponding discrete values are tabulated in Table 10. The results show that there is no meaningful color improvement when the particle size is too small (e.g., less than 300 nm) and also decreases when the particle gets to large (e.g., greater than 3000 nm). As a result, angular color shift indicates the preferred particle diameters are preferably in a range of 300 nm to 3 μm.

Polymer Molecular Weight Measurement Methods

The molecular weight distribution of the compounds was characterized using gel permeation chromatography (GPC). The GPC instrumentation, which was obtained from Waters Corporation (Milford, Mass.), included a high pressure liquid chromatography pump (Model 1515HPLC), an autosampler (Model 717), a UV detector (Model 2487), and a refractive index detector (Model 2410). The chromatograph was equipped with two 5-micrometer PL gel MIXED-D columns available from Varian Inc. (Palo Alto, Calif.).

Samples of polymeric solutions were prepared by dissolving dried polymer samples in tetrahydrofuran at a concentration of 1.0 percent (weight/volume) and filtering through a 0.2 micrometer polytetrafluoroethylene filter that is available from VWR International (West Chester, Pa.). The resulting samples were injected into the GPC and eluted at a rate of 1 milliliter per minute (ml/min) through the columns maintained at 35° C. The system was calibrated with polystyrene standards using a linear least squares analysis to establish a standard calibration curve. The weight average molecular weight (Mw) and the polydispersity index (weight average molecular weight divided by number average molecular weight (Mn)) were calculated for each sample against this standard calibration curve.

Sample Preparation

Sample Preparation Methods for Polymeric Film Examples

The diffusive polymeric film examples useful for WVC corrections were fabricated in three general product configurations or embodiments. The first is in the product configuration of a single optically diffusing adhesive layer, which is represented in Examples 1-22. The second is in the form of a non-adhesive thin volumetric diffusing element, which is represented in Examples 23-24. This second configuration would likely be useful in conjunction with an additional Optically Clear Adhesive (OCA) layer to enable affixation in an integrated lamination. The third product configuration incorporates two layers in concert, at least one being optically diffusive, which is represented in Examples 25-27.

Modelling Examples 28-75 are included to show the projected impact of particle size and loading levels on clarity, bulk haze, color shift (□(u',v') less than 45° viewing angle), and transmission.

Examples for Product Configuration 1: Diffusing Optical Adhesive

There were three types of example fabricated for product configuration 1: Single layer diffusing optical adhesive. The first set of examples (Examples 1-15) were coated out of solvent solution. The second set of examples (Examples 16-21) were coated from 100% solids. Lastly, Comparative Example 22 illustrates a phase separation optically diffusive material not incorporating particles per se.

Fabrication of Examples 1-15 (Solvent-Based)

In a glass jar, 400 grams (g) of OPPANOL B10 (PIB) and 1600 g of heptane were added together. The glass jar was placed on a roller mixer for a week, resulting in a homogenous 20 wt-% stock solution.

Formulations 1-4 were prepared accordingly to Table 1 below by adding different levels of TOSPEARL 120A beads. A sample of 250 g of the 20 wt-% t PIB stock solution as prepared above was transferred to 16-ounce jars, different levels of TOSPEARL 120A beads and additional heptane were added to maintain 20 wt-% solids, then jars were sealed, and placed on a roller for an additional 4 days.

The Refractive Index (RI) of PIB was measured as 1.53 at 632 nm, and the RI of TOSPEARL 120A beads is 1.42 as reported by the vendor.

Formulations 1-4 were then coated on a 3-mil (75 microns) thick RF22N liner using a 4-inch (100 mm) wide slot-type die at a line speed of 10 feet per minute (ft/min) (3.3 meters per minute), and several different flow rates to adjust the coating thickness. The tabulated values for coating thickness are estimated or approximate thicknesses based on the material and pumping speed that meters the material. The coating was dried at 200° F. (93° C.), then a 3-mil RF02N liner was laminated on the coating to keep the material clean. Using these compositions and changing the coating thickness yielded 15 examples.

TABLE 1

| Formulation Number | TOSPEARL 120A Beads (grams) | OPPANOL B10, 20 wt-% in Heptane (grams) | Heptane (grams) |
|---|---|---|---|
| 1 | 1.28 | 250 | 5.12 |
| 2 | 2.63 | 250 | 10.52 |
| 3 | 5.56 | 250 | 22.24 |
| 4 | 8.82 | 250 | 35.28 |

TABLE 2

Examples for Product Construction 1 (Single-layer Diffusing Adhesive Version - Solvent-based Coating)

| Example Number | Formulation Number | Particle Loading (vol-%) | Pump Speed | Coating Thickness, Estimated (microns) |
|---|---|---|---|---|
| CEx 1 | 1 | 2.50% | 8 | 9.3 |
| CEx 2 | 1 | 2.50% | 10 | 11.7 |
| Ex 3 | 1 | 2.50% | 12 | 14 |
| Ex 4 | 2 | 5% | 6 | 7 |
| Ex 5 | 2 | 5% | 8 | 9.3 |
| Ex 6 | 2 | 5% | 10 | 11.7 |
| Ex 7 | 2 | 5% | 12 | 14 |
| Ex 8 | 3 | 10% | 6 | 7 |
| Ex 9 | 3 | 10% | 8 | 9.3 |
| Ex 10 | 3 | 10% | 10 | 11.7 |
| Ex 11 | 3 | 10% | 12 | 14 |
| Ex 12 | 4 | 15% | 6 | 7 |
| Ex 13 | 4 | 15% | 8 | 9.3 |
| Ex 14 | 4 | 15% | 10 | 11.7 |
| Ex 15 | 4 | 15% | 12 | 14 |

Fabrication of Examples 16-21 (Solventless)

Formulations 5-7 were prepared for Examples 16-18 by adding different levels of TOSPEARL 120A beads to an adhesive solution prepared as follows. A monomer premix was prepared by adding EHA (55 parts), iBOA (25 parts), HEA (20 parts), and 0.02 part of D-1173. The mixture was partially polymerized under a nitrogen (inert) atmosphere by exposure to ultraviolet radiation generated by an ultraviolet light emitting diode (UVA-LED) to provide a coatable syrup having a viscosity of about 1000 centipoise (cps). Then HDDA (0.15 part), IRGACURE 651 (0.15 part), and KBM-403 (0.05 part) were added to the syrup to form a homogenous adhesive coating solutions.

For Formulation 5 (1 wt-% particle loading), 3 g of TOSPEARL 120A beads were added to 297 g of adhesive solution and then mechanically stirred using an overhead Jiffy LM Pint mixer (manufactured by Jiffy Mixer Co. Inc, Corona, Calif.) for 2 hours. After mechanical stirring, the admixture was placed on a mixing roller for an additional 24 hours.

For Formulation 6 (1.5 wt-% particle loading), 4.5 g of TOSPEARL 120A beads were added to 295.5 g of adhesive solution and then mechanically stirred using an overhead Jiffy LM Pint mixer for 2 hours. After mechanical stirring, the admixture was placed on a mixing roller for an additional 24 hours.

For Formulation 7 (2 wt-% particle loading), 6 g of TOSPEARL 120A beads were added to 294 g of adhesive solution and then mechanically stirred using an overhead Jiffy LM Pint mixer for 2 hours. After mechanical stirring, the admixture was placed on a mixing roller for an additional 24 hours.

TABLE 3

| Formulation Number | TOSPEARL 120A Beads (grams) | Adhesive Solution (grams) | Particle Loading (wt-%) |
|---|---|---|---|
| 5 | 3.0 | 297 | 1% |
| 6 | 4.5 | 295.5 | 1.5% |
| 7 | 6 | 294 | 2.0% |

Formulations 8 and 9 for Comparative Examples 19 and 20 were prepared by adding differing levels of TOSPEARL 145 beads to base adhesive material prepared as follows. A monomer premix was prepared by adding EHA (50 parts), iBOA (30 parts), HEA (20 parts), and 0.02 part of D-1173. The mixture was partially polymerized under a nitrogen atmosphere by exposure to ultraviolet radiation generated by UVA-LED to provide a coatable syrup having a viscosity of about 750 cps. Then HDDA (0.08 part), IRGACURE 651 (0.28 part), and KBM-403 (0.05 part) were added to the syrup to form a homogenous adhesive coating solution.

For Formulation 8, 9 g of TOSPEARL 145 beads were added to 291 g of base adhesive material. The mixture was then transferred to a closed container and placed on a mixing roller for additional 24 hours.

For Formulation 9, 11.4 g of TOSPEARL 145 beads were added to 288.6 g of base adhesive material. The mixture was then transferred to a closed container and placed on a mixing roller for additional 24 hours.

Examples of polymeric diffusing films (Examples 16-21) were prepared by knife-coating the corresponding formulation between two silicone-treated release liners at a thickness of either 25 microns or 50 microns. The resulting coated material was then exposed to low intensity ultraviolet radiation (a total energy of 1 Joule per square centimeter ($J/cm^2$)) having a spectral output from 300-400 nm with a maximum at 351 nm.

TABLE 4

| Formulation Number | TOSPEARL 145 Beads (grams) | Adhesive Solution (grams) | Particle Loading (wt-%) |
|---|---|---|---|
| 8 | 9.0 | 291 | 3% |
| 9 | 11.4 | 288.6 | 3.8% |

Phase Separation Polymer Comparative Example (CEx-22)

A bottle polymer was prepared as Formulation 10 by polymerizing acrylate monomers in the presence of a silicone polymer (30% solid in ethyl acetate), which was prepared according to Example 13 of WO 2011/082069A1 modified by replacing m-xylyl-bisoxamic acid trifluoroethyl ester (Example 4 of WO 2011/082069A1) with ethylene-bis-oxamic acid trifluoroethyl ester (Example 3 of WO 2011/082069A1). The coating solution was prepared in a 16-ounce jar by mixing butyl acrylate (BA), 2-hydroxyethyl acrylate (HEA), the silicone polymer solution, and VAZO 67 in the ratio of (BA/HEA/Silicone Polymer/VAZO 67=100/0.3/20/0.3 Parts). Additional ethyl acetate was added to adjust weight percent solids to 30 wt-%. Finally, the jar was sealed after bubbling under nitrogen for 20 min, and it was transferred to a water bath with controlled temp of 65° C. for 16 hours. This resulted in a hazy coating solution.

The solution was then coated on a RF12N liner to form a 15-micron dry thick adhesive and then laminated a RF02N liner after solvent was dried out. The resulting pressure sensitive adhesive (PSA) did not have good uniformity. An optical micrograph of the resulting PSA was taken. From optical micrographs, the phase separated "particle" sizes (actually not particles, but mixed phase spherical regions formed in situ) were estimated to range from 2-20 microns with a volume fraction estimated as approximately 20%.

TABLE 5

Additional Examples for Polymeric Film Composed of Single-layer Diffusing Adhesive

| Example Number | Formulation Number | Bead Loading (wt-%) | Coating Thickness, Estimated (microns) |
|---|---|---|---|
| Ex 16 | 5 | 1.0% | 50 |
| Ex 17 | 6 | 1.5% | 25 |
| Ex 18 | 7 | 2.0% | 25 |
| Ex 19 | 7 | 2.0% | 50 |
| CEx-20 | 8 | 3% | 50 |
| CEx-21 | 9 | 3.8% | 50 |
| CEx-22 | 10 | n.a. | 15 |

Examples 23-24 Non-Adhesive Diffusing Element

Non-adhesive diffusing element differs from previous examples in that these non-adhesive polyurethane layer examples likewise illustrate the modest diffusing effect that is beneficial for WVC correction.

Synthesis of UA-Polymer (Polyurethane Acrylate Solution)

To a resin reaction vessel equipped with a mechanical stirrer, a condenser, a thermocouple, and a nitrogen inlet, the following were added: 81.30 g hydroxyl terminated polyester PH-56 (a hydroxyl value of 57 mg KOH/g), 14.50 g DMPA, and 180.0 g of MEK. The solution was heated up to 75° C., then with stirring the following were added: 0.48 g DBTDA and 99.16 g of HDI. The temperature was further heated up to 80±2° C. until NCO content reached was the theoretical NCO value, which was determined by a standard dibutylamine back titration method. Upon obtaining the theoretical NCO value, the polyurethane was then chain extended adding a mixture of 40.0 g MEK and 40.0 g bisphenol A-glycidyl methacrylate, and allowed to react until no free NCO group was observed by FT-IR. During the reaction, 70 g of additional MEK was added into the reactor to dilute the system. Finally, the clear and transparent polyurethane solution with 45% solids was obtained. The measured GPC data is shown in Table 6 (Mn=number average molecular weight; Mw=weight average molecular weight; Mp=molar mass at peak maximum; Mz=z-average molecular weight; Pd=polydispersity). Units in grams/mole.

TABLE 6

|  | Mn | Mw | Mp | Mz | Pd |
|---|---|---|---|---|---|
| UA-Polymer | 37731 | 107873 | 55244 | 271595 | 2.859 |

Formulation 11 was prepared as follows: In a 16-ounce (500-gram) brown jar, 236.8 g of UA-polymer (46 wt-% solid in MEK), 37.62 g of CN104, 1.72 g of TPO, and 312 g of MEK were added. The final mixture was put on a roller for several hours to form a 25 wt-% solid coating solution. The RI of the coating after UV-cure was measured to be 1.55.

To the above solution, 16.3 g of TOSPEARL 120 beads and 100 g of MEK were added, and the mixture was rapidly stirred using an overhead Jiffy LM Pint mixer for 2 hours. After mechanical stirring, the admixture was placed on a mixing roller for an additional 24 hours before it was coated.

The coating solution was then applied on the release side of a 2-mil (50-microns) RF52N liner using a 20.3-cm (8-inch) slot-type die at a line speed of 5 ft/min (1.5 meter/min) and the adhesive flow rate was adjusted to tune the coating thickness. The coating was dried at 200° F. (93° C.), then a 2-mil (50-microns) RF02N liner was laminated on the coating. Finally, the coating was cured through the RF02N liner using a Fusion System Model 1600 (Fusion UV Systems, Gaithersburg, Md.). The Model 1600 was configured with an H-bulb and operated at 100% power.

TABLE 7

Examples for non-adhesive diffusing element

| Example Number | Formulation Number | Bead Loading (wt-%) | Coating Thickness, Estimated (microns) |
|---|---|---|---|
| Ex 23 | 11 | 10% | 9 |
| Ex 24 | 11 | 10% | 15 |

To use the non-adhesive diffusing element to OLED devices, a standard OCA such as 3M 8146 OCA can be laminated onto the polymeric film of Examples 23-24 to enable incorporation into a multilayer construction of an organic light emitting diode panel of a display device. Alternatively, it is possible to overcoat the polymeric film of Examples 23-24 using a solution polymer adhesives such as OPPANOL B10, B12, B15, N50, N80, N100, N150 polymers, which are commercially available from BASF. Such adhesives can also function as moisture and oxygen barriers.

Examples for Product Configuration 3: Dual-Layer Polymeric Film (Examples 25-27)

Base Optically Clear Adhesive Formulation (Base OCA): A monomer premix was prepared by adding EHA (55 parts), iBOA (25 parts), HEA (20 parts), and 0.02 part of D-1173. The mixture was partially polymerized under a nitrogen atmosphere by exposure to ultraviolet radiation generated by UVA-LED to provide a coatable syrup having a viscosity of about 1000 cps. Then HDDA (0.15 part), IRGACURE 651 (0.15 part), IRGACURE 819 (0.15 part), and KBM-403 (0.05 part) were added to the syrup to form a homogenous adhesive coating solutions.

"Diffusive" Adhesive Formulation A (DA-A): To 300 g of the Base Optically Clear Adhesive Formulation, 19.15 g of TOSPEARL 120A beads were added. The mixture was mechanically stirred using an overhead Jiffy LM Pint mixer for 2 hours, and then it was transferred to a closed container and placed on a roller for 24 hours.

"Diffusive" Adhesive Formulation B (DA-B): To 300 g of the Base Optically Clear Adhesive Formulation, 33.33 g of TOSPEARL 120A beads were added. The mixture was mechanically stirred using an overhead Jiffy LM Pint mixer for 2 hours, and then it was transferred to a closed container and placed on a roller for 24 hours.

The process for coating the dual layer product example used a dual slot fed knife coating die to deposit the coating solution onto a moving release liner substrate at 10 ft/min (3 meter/min). This was followed by UV pre-cure in an inert (nitrogen) atmosphere with dosage of 0.166 J/cm$^2$ UV-A from a 385-nm LED light source, as described in U.S. Pat. No. 8,808,811 (Kolb et al.). Following the pre-cure, the top liner was laminated and a final cure step used Fusion System Model I300P (H-bulb) at a dosage of 0.762 J/cm$^2$ of UV-A. The UV dose was measured using a high energy UV Integrating Radiometer (POWER PUCK, available from EIT Inc., Sterling, Va.). Coating thicknesses for each layer are controlled by the relative flow rates of the two materials to yield the thicknesses shown in Table 8.

TABLE 8

Examples for Product Construction 3 (Dual Layer)

| Example Number | Top Coating Solution | Bottom Coating | Thickness (microns) Top Layer | Thickness (microns) Bottom Layer |
|---|---|---|---|---|
| 25 | DA-A | Base OCA | 16 | 34 |
| 26 | DA-A | Base OCA | 12 | 38 |
| 27 | DA-B | Base OCA | 10 | 40 |

Measurement Results

TABLE 9

Measurement Results for Polymeric Film Samples of All Construction Types

| Example | Thickness (μm) | T (%) | H (%) | C (%) | Micro-haze Mean | Micro-haze STD | Micro-haze STD/Mean | Color Shift □(u', v') (<45°) | Shift Reduction |
|---|---|---|---|---|---|---|---|---|---|
| *Single layer adhesives:* | | | | | | | | | |
| CEx 1 | 9.3 | 92.5 | 13.4 | 99.1 | | | | 0.0097 | 12% |
| CEx 2 | 11.7 | 92.4 | 14.7 | 99 | | | | 0.0099 | 10% |
| Ex 3 | 14 | 92.6 | 16.7 | 98.8 | | | | 0.0098 | 11% |
| Ex 4 | 7 | 92.5 | 17.1 | 99.2 | | | | 0.0095 | 14% |
| Ex 5 | 9.3 | 92.3 | 21.1 | 98.4 | | | | 0.0098 | 11% |
| Ex 6 | 11.7 | 92.7 | 25.6 | 98 | | | | 0.0091 | 17% |
| Ex 7 | 14 | 92.5 | 28.9 | 97.3 | | | | 0.0092 | 16% |
| Ex 8 | 7 | 92.3 | 30.9 | 98.3 | | | | 0.0097 | 12% |
| Ex 9 | 9.3 | 92.6 | 36.4 | 96.2 | | | | 0.0088 | 20% |
| Ex 10 | 11.7 | 92.8 | 42.1 | 94.3 | | | | 0.0079 | 28% |
| Ex 11 | 14 | 92.7 | 45.9 | 91.5 | | | | 0.0077 | 30% |
| Ex 12 | 7 | 92.5 | 40.4 | 96.4 | | | | 0.0079 | 28% |
| Ex 13 | 9.3 | 92.7 | 46.4 | 91.3 | | | | 0.0076 | 31% |
| Ex 14 | 11.7 | 93 | 56.5 | 91.2 | | | | 0.0078 | 29% |
| Ex 15 | 14 | 92.8 | 62.8 | 91 | | | | 0.0073 | 34% |
| Control (Ex 1-15) | 25 | 92.2 | 0.67 | 99.8 | | | | 0.0110 | |
| Ex 16 | 50 | 92.1 | 24.2 | 99.1 | 0.0891 | 0.0092 | 10% | 0.008 | 27% |
| Ex 17 | 25 | 92.2 | 26.3 | 99 | 0.0783 | 0.0094 | 12% | 0.008 | 27% |
| Ex 18 | 25 | 92 | 31.5 | 98.7 | 0.0800 | 0.0090 | 11% | 0.008 | 27% |
| Ex 19 | 50 | 92.5 | 45 | 98.1 | 0.1150 | 0.0104 | 9% | 0.007 | 36% |
| CEx 20 | 50 | | 45.4 | | 0.2082 | 0.0257 | 12% | NA | |
| CEx 21 | 50 | | 56 | | 0.2114 | 0.0273 | 13% | NA | |
| CEx 22 | 15 | 90.6 | 48.4 | 81.9 | 0.1079 | 0.0203 | 19% | 0.008 | 27% |
| *Single Layer Non-Adhesive* | | | | | | | | | |
| Ex 23 | 9 | 92.6 | 68.3 | 93.8 | | | | NA | |
| CEx 24 | 15 | 91.5 | 80.4 | 88.7 | | | | NA | |
| *Double Layer* | | | | | | | | | |
| Ex 25 | 50 | 91.5 | 41.5 | 97.3 | | | | 0.0074 | 33% |
| Ex 26 | 50 | 91.8 | 32 | 97.8 | | | | 0.0081 | 26% |
| Ex 27 | 50 | 90.1 | 42.6 | 96.2 | | | | 0.0067 | 39% |
| Control (OCA) | 50 | | | | | | | 0.0106 | 4% |

TABLE 10

Modeled Examples (Single Diffusion Layer Thickness Was 20 Microns)

| Example | Particle Size (nm) | Particle Loading (vol-%) | T (%) | H (%) | C (%) | Color Shift □(u', v') (<45°) | Shift Reduction |
|---|---|---|---|---|---|---|---|
| CEx 28 | 200 | 2.5 | 91% | 2% | 100% | 0.0076 | 0% |
| CEx 29 | 300 | 2.5 | 91% | 4% | 100% | 0.0076 | 0% |
| CEx 30 | 400 | 2.5 | 92% | 6% | 100% | 0.0074 | 3% |
| CEx 31 | 500 | 2.5 | 92% | 9% | 100% | 0.0072 | 5% |
| Ex 32 | 1000 | 2.5 | 92% | 18% | 100% | 0.0069 | 9% |

TABLE 10-continued

Modeled Examples (Single Diffusion Layer Thickness Was 20 Microns)

| Example | Particle Size (nm) | Particle Loading (vol-%) | Bulk Property T (%) | H (%) | C (%) | Color Shift $\Delta$(u', v') (<45°) | Shift Reduction |
|---|---|---|---|---|---|---|---|
| Ex 33 | 2000 | 2.5 | 92% | 31% | 98% | 0.0070 | 8% |
| Ex 34 | 3000 | 2.5 | 92% | 35% | 96% | 0.0070 | 8% |
| CEx 35 | 4000 | 2.5 | 92% | 33% | 93% | 0.0070 | 8% |
| CEx 36 | 200 | 5 | 91% | 4% | 100% | 0.0077 | −1% |
| CEx 37 | 300 | 5 | 91% | 8% | 100% | 0.0077 | −1% |
| CEx 38 | 400 | 5 | 91% | 12% | 100% | 0.0072 | 5% |
| Ex 39 | 500 | 5 | 91% | 17% | 100% | 0.0067 | 12% |
| Ex 40 | 1000 | 5 | 92% | 34% | 100% | 0.0062 | 18% |
| Ex 41 | 2000 | 5 | 92% | 51% | 97% | 0.0065 | 14% |
| Ex 42 | 3000 | 5 | 92% | 57% | 91% | 0.0065 | 14% |
| CEx 43 | 4000 | 5 | 92% | 54% | 85% | 0.0065 | 14% |
| CEx 44 | 200 | 10 | 89% | 8% | 100% | 0.0077 | −1% |
| CEx 45 | 300 | 10 | 89% | 15% | 100% | 0.0077 | −1% |
| Ex 46 | 400 | 10 | 89% | 24% | 100% | 0.0068 | 11% |
| Ex 47 | 500 | 10 | 90% | 31% | 100% | 0.0060 | 21% |
| Ex 48 | 1000 | 10 | 91% | 56% | 99% | 0.0050 | 34% |
| Ex 49 | 2000 | 10 | 92% | 76% | 92% | 0.0054 | 29% |
| CEx 50 | 3000 | 10 | 92% | 80% | 77% | 0.0054 | 29% |
| CEx 51 | 4000 | 10 | 92% | 78% | 66% | 0.0054 | 29% |
| CEx 52 | 200 | 20 | 86% | 16% | 100% | 0.0079 | −4% |
| CEx 53 | 300 | 20 | 86% | 29% | 100% | 0.0079 | −4% |
| Ex 54 | 400 | 20 | 86% | 41% | 100% | 0.0063 | 17% |
| Ex 55 | 500 | 20 | 88% | 52% | 100% | 0.0049 | 36% |
| Ex 56 | 1000 | 20 | 90% | 80% | 97% | 0.0032 | 58% |
| CEx 57 | 2000 | 20 | 91% | 93% | 74% | 0.0038 | 50% |
| CEx 58 | 3000 | 20 | 92% | 94% | 36% | 0.0037 | 51% |
| CEx 59 | 4000 | 20 | 92% | 93% | 18% | 0.0037 | 51% |
| CEx 60 | 200 | 30 | 83% | 23% | 100% | 0.0082 | −8% |
| CEx 61 | 300 | 30 | 83% | 40% | 100% | 0.0082 | −8% |
| CEx 62 | 400 | 30 | 83% | 55% | 100% | 0.0061 | 20% |
| CEx 63 | 500 | 30 | 84% | 67% | 100% | 0.0045 | 41% |
| CEx 64 | 1000 | 30 | 88% | 91% | 95% | 0.0022 | 71% |
| CEx 65 | 2000 | 30 | 90% | 97% | 40% | 0.0027 | 64% |
| CEx 66 | 3000 | 30 | 91% | 97% | 0% | 0.0025 | 67% |
| CEx 67 | 4000 | 30 | 92% | 97% | 0% | 0.0026 | 66% |
| CEx 68 | 200 | 40 | 81% | 29% | 100% | 0.0087 | −14% |
| CEx 69 | 300 | 40 | 80% | 49% | 100% | 0.0087 | −14% |
| CEx 70 | 400 | 40 | 80% | 66% | 100% | 0.0062 | 18% |
| CEx 71 | 500 | 40 | 81% | 77% | 99% | 0.0047 | 38% |
| CEx 72 | 1000 | 40 | 85% | 96% | 90% | 0.0020 | 74% |
| CEx 73 | 2000 | 40 | 89% | 99% | 1% | 0.0022 | 71% |
| CEx 74 | 3000 | 40 | 91% | 98% | 0% | 0.0018 | 76% |
| CEx 75 | 4000 | 40 | 91% | 98% | 0% | 0.0020 | 74% |

Examples labelled as comparative (i.e., CEx-#) are those which result in transmission, bulk haze, and/or clarity are outside of desired performance range.

TABLE 11

Comparison of Subjective Visual Quality Rankings and Observations

| Example | Normalized Micro-Haze Non-uniformity (%) | Display Graininess (Samsung S5) Description | Score |
|---|---|---|---|
| Ex 16 | 10% | none | 0 |
| Ex 17 | 12% | almost none | 1 |
| Ex 18 | 11% | very mild | 2 |
| Ex 19 | 9% | none | 0 |
| CEx 20 | 12% | medium | 5 |
| CEx 21 | 13% | medium | 5 |
| CEx 22 | 19% | heavy | 10 |

Visual Graininess (Human Visual Rankings from Samsung S5 Comparisons)

The complete disclosures of the patents, patent documents, and publications cited herein are incorporated by reference in their entirety as if each were individually incorporated. Various modifications and alterations to this disclosure will become apparent to those skilled in the art without departing from the scope and spirit of this disclosure. It should be understood that this disclosure is not intended to be unduly limited by the illustrative embodiments and examples set forth herein and that such examples and embodiments are presented by way of example only with the scope of the disclosure intended to be limited only by the claims set forth herein as follows.

What is claimed is:

1. A polymeric film comprising:
   a first polymeric layer having two major surfaces, wherein the first polymeric layer comprises:
   a first polymeric matrix having a refractive index $n_1$; and
   particles having a refractive index $n_2$ uniformly dispersed within the first polymeric matrix;
   wherein the particles are present in an amount of less than 30 vol-%, based on the volume of the first polymeric layer, and have a particle size range of 400 nm to 3000 nm; and
   wherein $n_1$ is different than $n_2$;

wherein the polymeric film has:
a clarity of at least 80%;
a visible light transmission of at least 85%;
a bulk haze of 15% to 80%; and
a normalized micro-haze non-uniformity of not more than 12% across the polymeric film.

2. The polymeric film of claim 1 further comprising a second polymeric layer disposed on one major surface of the first polymeric layer; wherein the second polymeric layer comprises a second polymeric matrix having a refractive index $n_3$; wherein the first polymeric matrix and the second polymeric matrix are the same or different; and wherein at least one of the first polymeric matrix and the second polymeric matrix is an adhesive matrix.

3. The polymeric film of claim 2 wherein the first polymeric matrix and the second polymeric matrix each comprises an adhesive matrix.

4. The polymeric film of claim 3 wherein the first adhesive matrix is different than the second adhesive matrix.

5. The polymeric film of claim 4 wherein $n_1$ is within 0.2 unit of $n_3$.

6. The polymeric film of claim 2 wherein the second polymeric layer has a thickness of at least 25 microns.

7. The polymeric film of claim 2 wherein at least one adhesive matrix comprise an optically clear adhesive.

8. The polymeric film of claim 2 wherein the first polymeric matrix and/or the second polymeric matrix comprise a multiphase morphology.

9. The polymeric film of claim 1 wherein the particles have a particle size range of 700 nm to 2.0 microns.

10. The polymeric film of claim 1 wherein the particles are present in the first polymeric matrix in an amount of at least 0.5 vol-%, and up to 25 vol-%, based on the total volume of the first polymeric layer.

11. The polymeric film of claim 1 wherein the first polymeric layer has a thickness of at least 10 microns and up to 100 microns.

12. The polymeric film of claim 1 wherein the polymeric film has a thickness of at least 35 microns and up to 130 microns.

13. The polymeric film of claim 1 wherein the particles comprise an organic polymeric material selected from a polydimethylsiloxane (PDMS), a polyurethane, a polymethyl methacrylate (PMMA), a polystyrene, or a combination thereof.

14. The polymeric film of claim 1 wherein $n_1$ is 0.01 to 0.5 unit different than $n_2$.

15. The polymeric film of claim 1 wherein the first polymeric matrix comprises an acrylate, a polyurethane, a polyolefin, a silicone, or a combination thereof.

16. The polymeric film of claim 15 wherein the first polymeric matrix comprises a polyolefin.

17. The polymeric film of claim 16 wherein the first polymeric matrix comprises polyisobutylene.

18. A display device comprising:
an organic light emitting diode panel having a multi-layer construction comprising one or more adhesive films; and
a polymeric film of claim 1 incorporated within the multi-layer construction of the organic light emitting diode panel; wherein the polymeric film comprises at least one adhesive matrix.

19. The display device of claim 18 having an off-axis color shift (0-45°) that is at least 5% better than an off-axis color shift compared to a display device that includes a non-diffusive optically clear adhesive in place of the polymeric film.

20. The device of claim 19 having an off-axis color shift (0-60°) that is at least 5% better than an off-axis color shift compared to a display device that includes a non-diffusive optically clear adhesive in place of the polymeric film.

21. The device of claim 18 which is flexible or rigid.

* * * * *

UNITED STATES PATENT AND TRADEMARK OFFICE
CERTIFICATE OF CORRECTION

PATENT NO. : 10,797,269 B2  
APPLICATION NO. : 16/674530  
DATED : October 6, 2020  
INVENTOR(S) : Encai Hao et al.

Page 1 of 1

It is certified that error appears in the above-identified patent and that said Letters Patent is hereby corrected as shown below:

On the Title Page

Item (57) (Abstract),  
Line 7, delete "ni;" and insert -- $n_1$; --, therefor.

In the Specification

Column 5,  
Line 55-63, delete "A polymeric film of the present disclosure has the following characteristics: a clarity of at least 80% (preferably at least 85%, or more preferably at least 90%); a visible light transmission of at least 85% (preferably at least 90%); a bulk haze of 15% to 80% (preferably 20% to 80%, more preferably 30% to 70%, and even more preferably 30% to 50%); and a normalized micro-haze non-uniformity of not more than 12% (preferably less than 10%, or more preferably less than 8%) across the polymeric film." and insert the same on Column 5, Line 55, as a new paragraph.

Column 14,  
Line 12-14, delete "Embodiment 10 is the polymeric film of any of embodiments 1 to 9 wherein the particles have a particle size range of 700 nm to 2.0 microns." and insert the same on Column 14, Line 13, as a new paragraph.

Column 18,  
Line 1-3, delete "Embodiment 62 is the polymeric film or display device of embodiment 61 wherein the first polymeric matrix comprises a polyolefin." and insert the same on Column 18, Line 2, as a new paragraph.

Column 17-18 (table),  
Line 40 (approx.), delete "polyeser" and insert -- polyester --, therefor.

Signed and Sealed this  
Eighteenth Day of May, 2021

Drew Hirshfeld  
*Performing the Functions and Duties of the  
Under Secretary of Commerce for Intellectual Property and  
Director of the United States Patent and Trademark Office*